(12) United States Patent  
Khandros et al.

(10) Patent No.: US 7,579,856 B2
(45) Date of Patent: Aug. 25, 2009

(54) PROBE STRUCTURES WITH PHYSICALLY SUSPENDED ELECTRONIC COMPONENTS

(75) Inventors: Igor Y. Khandros, Orinda, CA (US); John K. Gritters, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 11/379,760

(22) Filed: Apr. 21, 2006

(65) Prior Publication Data
US 2007/0247175 A1 Oct. 25, 2007

(51) Int. Cl.
*G01R 31/02* (2006.01)
(52) U.S. Cl. ...................... 324/762; 324/754
(58) Field of Classification Search .................. None
See application file for complete search history.

(56) References Cited

U.S. PATENT DOCUMENTS

| | | | |
|---|---|---|---|
| 4,747,784 A * | 5/1988 | Cedrone | 439/71 |
| 4,894,612 A * | 1/1990 | Drake et al. | 324/754 |
| 5,491,426 A | 2/1996 | Small | |
| 5,565,788 A * | 10/1996 | Burr et al. | 324/762 |
| 5,639,385 A * | 6/1997 | McCormick | 216/14 |
| 5,734,176 A * | 3/1998 | Oldfield | 257/48 |
| 5,748,002 A * | 5/1998 | Scott et al. | 324/633 |
| 5,841,982 A * | 11/1998 | Brouwer et al. | 709/224 |
| 5,903,143 A * | 5/1999 | Mochizuki et al. | 324/72.5 |
| 6,046,599 A * | 4/2000 | Long et al. | 324/762 |
| 6,491,968 B1 * | 12/2002 | Mathieu et al. | 29/842 |
| 6,617,864 B2 * | 9/2003 | Inoue et al. | 324/754 |
| 6,729,019 B2 | 5/2004 | Grube et al. | |
| 6,811,406 B2 | 11/2004 | Grube | |
| 7,075,320 B2 * | 7/2006 | Hayden et al. | 324/754 |
| 7,265,562 B2 * | 9/2007 | Chen et al. | 324/754 |
| 7,427,868 B2 * | 9/2008 | Strid et al. | 324/754 |
| 2003/0010976 A1 * | 1/2003 | Grube et al. | 257/48 |
| 2006/0038576 A1 * | 2/2006 | Tadayon | 324/761 |

\* cited by examiner

*Primary Examiner*—Paresh Patel
(74) *Attorney, Agent, or Firm*—N. Kenneth Burraston

(57) ABSTRACT

A probe apparatus can include a substrate, a contact structure attached to the substrate, and an electronic component electrically connected to the contact structure. The electronic component can be attached to the contact structure.

18 Claims, 33 Drawing Sheets

PROBE STRUCTURES WITH PHYSICALLY SUSPENDED ELECTRONIC COMPONENTS

BACKGROUND

Small or micro sized probe structures comprising a tip portion for making contact (i.e., probing) an object are known. For example, such probe structures can be used with other equipment to test an electronic device, such as one or more semiconductor dies. Tips of the probes can be pressed against input and/or output terminals of the electronic device to make electrical connections with the electronic device. Test data can then be input through ones of the probes into the electronic device, and response data generated by the electronic device can be read from the electronic device through others of the probes. Embodiments of the present invention relate to improved methods of making probes, and some embodiments relate in particular to methods of making probes with one or more integrally formed electronic components. Embodiments of the present invention also relate to locating an electronic component in close proximity to a contact tip of a probe.

SUMMARY

In some embodiments, a probe apparatus can include a substrate, a contact structure attached to the substrate, and electronic component electrically connected to the contact structure. The electronic component can be attached to the contact structure.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for ease of illustration and clarity. In addition, as the term "on" is used herein, one object (e.g., a material, a layer, a substrate, etc.) can be "on" another object regardless of whether the one object is directly on the other object or there are one or more intervening objects between the one object and the other object.

Figure 1:
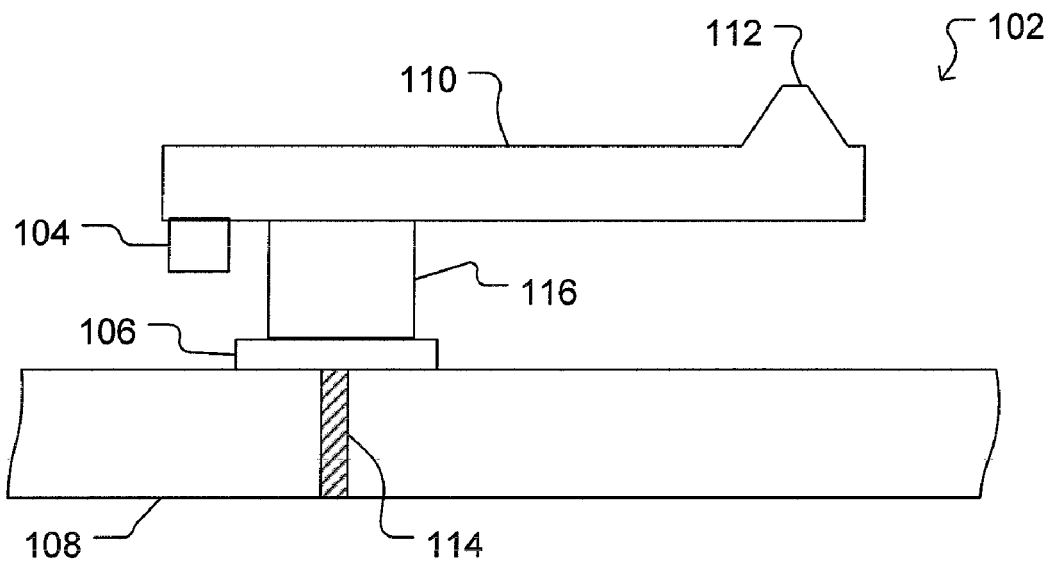
FIG. 1 illustrates an exemplary probe structure with an attached formed electronic element according to some embodiments of the invention.

FIG. 1 illustrates an exemplary probe structure 102 with an attached electronic component 104 according to some embodiments of the invention. As shown in FIG. 1, probe structure 102 can be attached to an electrically conductive terminal 106 of a substrate 108, which can include an electrically conductive via 114 for electrically connecting the terminal 106 with another terminal (not shown) or other electrical elements (not shown) on or in substrate 108. Alternatively or in addition, terminal 106 can be electrically connected to other terminals (not shown) or electrical elements (not shown) on or in substrate 108 by an electrically conductive trace (not shown) disposed on a surface of or within substrate 108. Substrate 108 can comprise any material. For example, substrate 108 can comprise, without limitation, one or a combination of the following materials: printed circuit board material, ceramics, organic materials, inorganic materials, plastics, etc.

As also shown in FIG. 1, probe structure 102, which can be made of one or more electrically conductive materials, can comprise a cantilevered beam 110 and a contact tip 112. The contact tip 112 can be configured to be pressed against a terminal (not shown) of an electronic device (not shown). Beam 110 can be flexible and resilient and thus produce a counter force that holds the tip 112 against the terminal (not shown) of the electronic device (not shown). Probe structure 102 can thus establish an electrical connection between substrate 108 and the electronic device (not shown).

As mentioned above, probe structure 102 can include an electrical component 104. For example, the electrical component 104 can be formed with or added (e.g., as a separately fabricated, discrete electronic component) to the probe structure during the process of forming the probe structure 102. The electrical component 104 can thus be integrated into probe structure 102. Of course, more than one electrical component 104 can be integrated into or formed with probe structure 102 or attached to the probe structure 102 after the probe structure 102 is fabricated.

Electrical component 104 can be any electrical element or component. Non-limiting examples of electrical component 104 include one or more resistors, capacitors, inductors, diodes, transistors, a driver circuit, integrated circuits (e.g., a circuit integrated into a semiconductor material), etc. Non-limiting examples of integrated circuits include a driver circuit, a digital processor, a digital memory, a digital logic circuit, analog circuitry, or any combination of the foregoing. Moreover, although one probe structure 102 is shown in FIG. 1, a plurality of probe structures 102 can be attached to substrate 108. For example, a plurality of probe structures 102 can be attached to a plurality of terminals 106 on substrate 108. In such a case, one or more of the probe structures 102 can be electrically connected to the electrical component 104, and the electrical component 104 can be made with or attached to the probe structures 102 during or after the process of making the probe structures.

The configuration of probe structure 102 in FIG. 1 is exemplary only, and many other configurations of probe structure 102 are possible. Non-limiting examples of other suitable configurations of probe structure 102 include composite structures formed of a core wire bonded to a conductive terminal, like terminal 106, on a substrate, like substrate 108, and over coated with a resilient material as described in U.S. Pat. Nos. 5,476,211, 5,917,707, and 6,336,269. Probe structure 102 can alternatively be a lithographically formed structure, like probes and spring elements disclosed in U.S. Pat. Nos. 5,994,152, 6,033,935, 6,255,126, 6,945,827, U.S. Patent Application Publication No. 2001/0044225, and U.S. Patent Application Publication No. 2004/0016119. Still other non-limiting examples of suitable configurations for probe structure 102 include probes disclosed in U.S. Pat. Nos. 6,827,584, 6,640,432, 6,441,315, and U.S. Patent Application Publication No. 2001/0012739. Other non-limiting examples of configurations of probe structure 102 include conductive pogo pins, bumps, studs, stamped springs, needles, buckling beams, etc.

Figure 2:
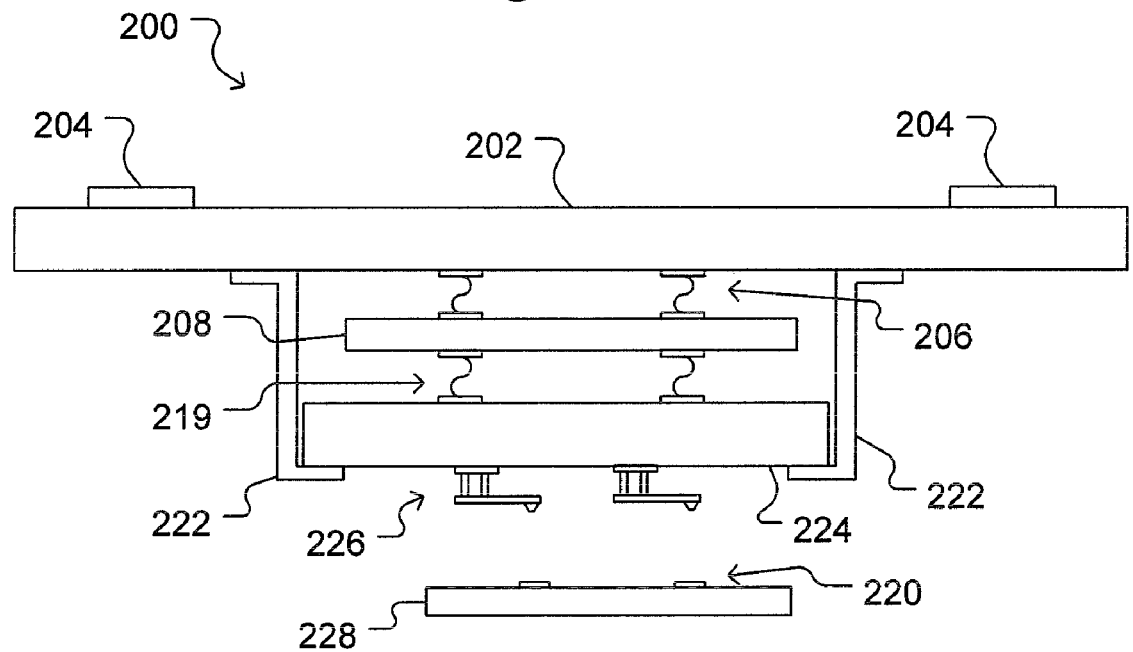
FIG. 2 illustrates an exemplary probe card assembly according to some embodiments of the invention.

There are many possible applications and uses for a probe structure, like probe structure 102 of FIG. 1. FIG. 2, which shows an exemplary probe card assembly 200 according to some embodiments of the invention, illustrates one such application or use.

The exemplary probe card assembly 200 illustrated in FIG. 2 can be used to test one or more electronic devices hereinafter referred to as a device under test or "DUT" 228. DUT 228 can be any electronic device or devices to be tested. Non-limiting examples of DUT 228 include one or more dies of an unsingulated semiconductor wafer, one or more semiconductor dies singulated from a wafer (packaged or unpackaged), an array of singulated semiconductor dies disposed in a carrier or other holding device, one or more multi-die electronics modules, one or more printed circuit boards, or any other type of electronic device or devices. Note that the term DUT, as used herein, refers to one or a plurality of such electronic devices.

The probe card assembly 200 can act as an interface between a tester (not shown) and the DUT 228. The tester (not shown), which can be a computer or a computer system, can control testing of the DUT 228. For example, the tester (not shown) can generate test data to be input into the DUT 228, and the tester (not shown) can receive and evaluate response data generated by the DUT 228 in response to the test data. Probe card assembly 200 can include electrical connectors 204, which can make electrical connections with a plurality of communications channels (not shown) from the tester (not shown). Probe card assembly 200 can also include probes 226 configured to be pressed against and thus make electrical connections with input and/or output terminals 220 of DUT 228.

Probe card assembly 200 can also include one or more substrates configured to support connectors 204 and probes 226 and provide electrical connections between connectors 204 and probes 226. The exemplary probe card assembly 200 shown in FIG. 2 has three such substrates, although in other implementations, probe card assembly 200 can have more or fewer substrates. Shown in FIG. 2 are a wiring substrate 202, an interposer substrate 208, and a probe substrate 224. Wiring substrate 202, interpose substrate 208, and probe substrate 224 can be made of any type of substrate. Examples of suitable substrates include without limitation printed circuit board, a ceramic substrate, an organic or inorganic substrate, etc. Combinations of the forgoing are also possible.

Electrically conductive paths (not shown) can be provided from connectors 204 through wiring substrate 202 to electrically conductive spring interconnect structures 206. Other electrically conductive paths (not shown) can be provided from spring interconnect structures 206 through interposer substrate 208 to electrically conductive spring interconnect structures 219, and still other electrically conductive paths (not shown) can be provided from spring interconnect structures 219 through probe substrate 224 to probes 226. The electrical paths (not shown) through the wiring substrate 202, interposer substrate 208, and probe substrate 224 can comprise electrically conductive vias, traces, etc. on, within, and/or through wiring substrate 202, interposer substrate 208, and probe substrate 224.

Wiring substrate 202, interposer substrate 208, and probe substrate 224 can be held together by brackets 222 and/or other suitable means. The configuration of probe card assembly 200 shown in FIG. 2 is exemplary only and is simplified for ease of illustration and discussion. Many variations, modifications, and additions are possible. For example, a probe card assembly 200 can have fewer or more substrates (e.g., 202, 208, 224) than the probe card assembly 200 shown in FIG. 2. As another example, the probe card assembly 200 can have more than one probe substrate (e.g., 224), and each such probe substrate can be independently adjustable. Non-limiting examples of probe card assemblies with multiple probe substrates are disclosed in U.S. patent application Ser. No. 11/165,833, filed Jun. 24, 2005. Additional non-limiting examples of probe card assemblies are illustrated in U.S. Pat. Nos. 5,974,622 and 6,509,751 and the aforementioned U.S. patent application Ser. No. 11/165,833, filed Jun. 24, 2005, and various features of the probe card assemblies described in those patents and application can be implemented in the probe card assembly 200 show in FIG. 2.

Probes 226, which can be like probe structure 102, of probe card assembly 200 can include one or more integrated electrical components, like electrical component 104 of FIG. 1. There are many possible uses for one or more electrical components, like electrical component 104, integrated into or formed with probes 226 of probe card assembly 200.

Figure 3:
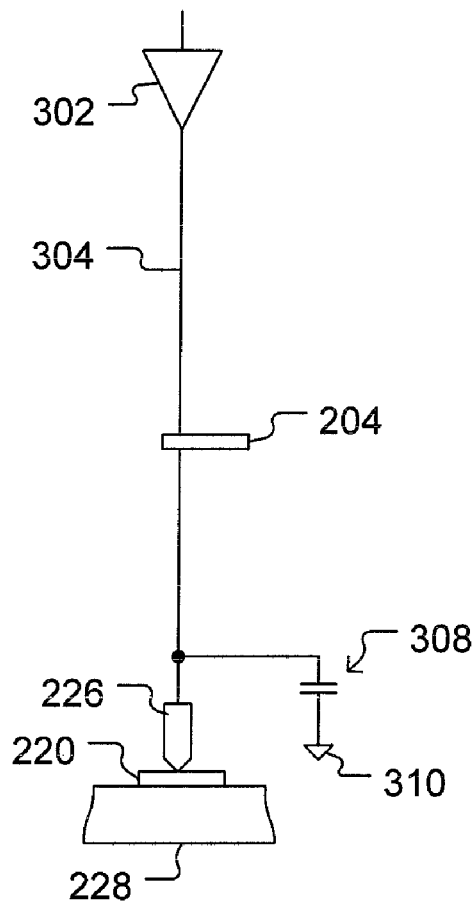
FIG. 3 illustrates a simplified schematic diagram of a communications channel and a decoupling capacitor according to some embodiments of the invention.

FIG. 3 illustrates an example of one such use. FIG. 3 illustrates an exemplary communications channel 304 through which power can be provided to DUT 228. As shown, a drive circuit 302 can drive power (e.g., a five volt signal) onto channel 304. As discussed above with respect to FIG. 2, channel 304 can be electrically connected to connector 204 of probe card assembly 200 (see also FIG. 2), which can be further connected to a probe 226 configured to contact a power input terminal 220 on DUT 228. Alternatively, driver 302 can provide data, test, control, or other types of signals through channel 304. Driver 302 can be located in the tester (not shown) or in other locations. As an alternative to the configuration shown in FIG. 3, driver 302 can be located on probe card assembly 200.

As shown in FIG. 3, a capacitor 308 can be electrically connected from channel 304 to ground 310, and capacitor 308 can be sized to filter noise from the power signal driven by driver 302 onto channel 304. For example, capacitor 308 can be sized to filter high frequency noise from the power signal driven onto channel 304, which can be caused by operation of the DUT 228. Capacitor 308 can thus function as a decoupling capacitor. Capacitor 308 can be integrated into or made with one or more of probes 226 of probe card assembly 200.

In fact, capacitor 308 can be integrated into the formation of two or more probes 226 such that capacitor 308 electrically connects one or more of probes 226 configured to provide power to DUT 228 with one or more others of probes 226 configured to provide ground connections to DUT 228. Alternatively capacitor 308 can be attached to (e.g., soldered to) one or more of probes 226. Regardless of whether capacitor 308 is integrated into the formation of probes 226 or attached to the probes 226, in some embodiments, parasitic effects (e.g., parasitic capacitance) can be reduced or eliminated by locating the decoupling capacitor 308 close to the probes 226. In fact, generally speaking, the closer the capacitor 308 is located to a contact tip of a probe 226, the less the parasitic effects.

Figure 4:
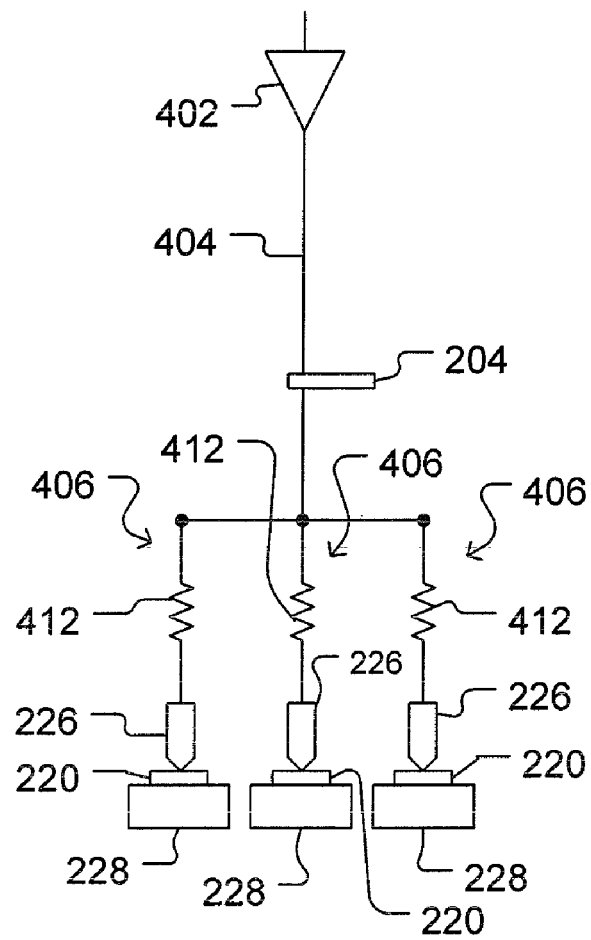
FIG. 4 illustrates a simplified schematic diagram of a communications channel with a plurality of branches and isolation resistors in each branch according to some embodiments of the invention.

FIG. 4 illustrates another exemplary use for one or more electrical components, like electrical component 104, integrated into or formed with probes 226 of probe card assembly 200. As shown, a driver circuit 402 can drive test data onto a communications channel 404. Channel 404 can be generally like channel 304, and as shown in FIG. 4, can be electrically connected to a connector 204 of probe card assembly 200. Driver 402 can be located in the tester (not shown) or in other locations. As an alternative to the configuration shown in FIG. 4, driver 402 can be located on probe card assembly 200. As yet another alternative, driver 402 can provide power or ground through channel 404.

As shown in FIG. 4, test data driven by driver 402 onto communications channel 404 can be provided to a plurality of probe 226 through a plurality of electrically conductive branches 406 (three are shown but more or fewer can be implemented). In this way, test data generated by the tester (not shown) for input into one DUT 228 can be used to test a plurality of DUTs 228 (again three are shown in FIG. 4 but more or fewer can be implemented).

As also shown in FIG. 4, each branch 406 can include an isolation resistor 412, which can prevent a short-to-ground fault at one terminal 220 shown in FIG. 4 from also shorting the other terminals 220 to ground. That is, isolation resistors 412 can provide a measure of electrical isolation between probes 226 that are electrically connected through branches 406. For example, if one of the probes 226 shown in FIG. 4 contacts a DUT 228 terminal 220 that has a short-to-ground fault (i.e., the terminal 220 is shorted to ground), all of the probes 226 shown in FIG. 4 could tend to be pulled toward ground because all of the probes 226 are electrically connected to each other. Thus, the short-to-ground fault on one of the DUTs 228 contacted by the probes 226 shown in FIG. 4 could register ground level voltages on all of the probes 226, causing all of the DUTs 228 to test as bad when, in fact, only one of the DUTs 228 is bad. Because the isolation resistors 412 provide a measure of electrical isolation for each probe 226, isolation resistors 412, can prevent a short-to-ground fault, among other faults, at one probe 226 from adversely affecting the other probes 226. The proper size of resistors 412 can depend on the system and the voltage levels used in the system. Generally speaking, resistors 412 should be sized such that, if one of probes 226 contacts a terminal 220 that is shorted to ground while a high logic level voltage is on the probes 226, the other probes 226 maintain a voltage sufficient to be deemed a high logic level voltage in accordance with the specifications of the system. Resistors 412 can be integrated into or made with one or more of probes 226 of probe card assembly 200, or alternatively, resistors 412 can be soldered to or otherwise affixed to probes 226.

FIGS. 3 and 4 illustrate but two possible uses for one or more electrical components integrated into probes 226 of probe card assembly 200. Other possible uses exist. For example, as mentioned above, electrical component 104 (see FIG. 1) can be one or more active integrated circuits. As one example, electrical component 104 can comprise a processor (not shown) and a memory (not shown) containing software (including without limitation software, firmware, and microcode) that the processor runs. Such a processor can, for example, be programmed to perform some or all of the functions typically performed by the tester (not shown) of generating test data to be input into DUT 228 and evaluating response data generated by DUT 228 in response to the test data. Thus, some or all of the functions described above as performed by the tester (not shown) can be implemented in integrated processor and memory circuits that compose electrical component 104. As yet another alternative, different ones of the probes 226 of probe card assembly 200 can have different types of electronic components 104.

Figure 11A:
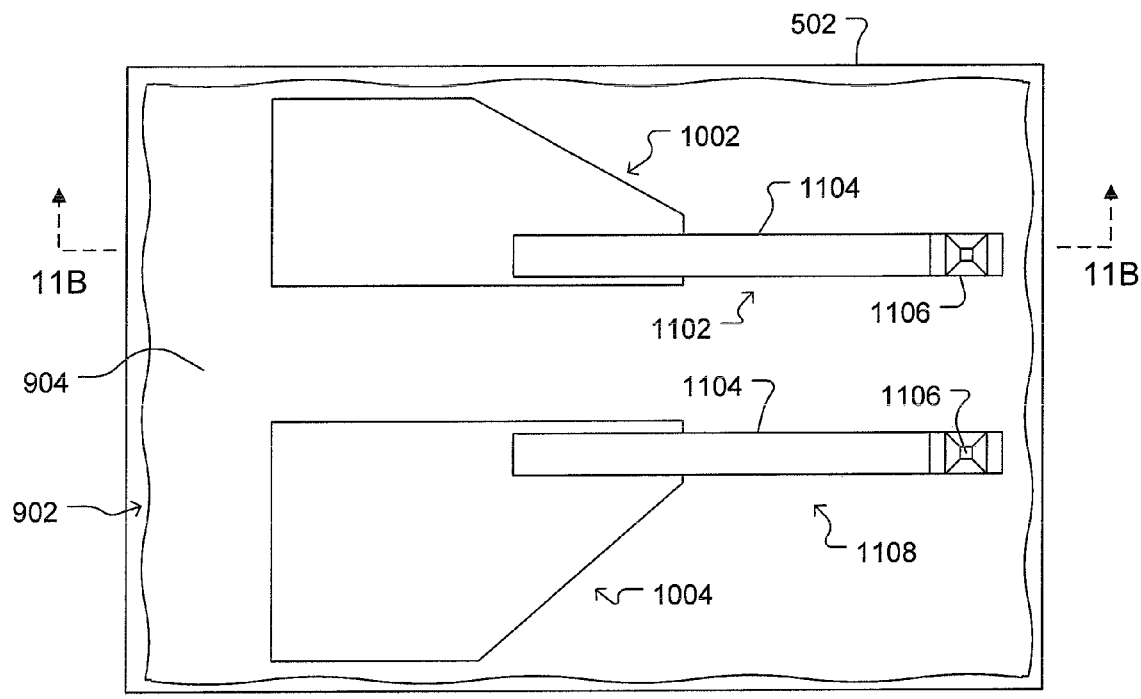
Figure 11B:
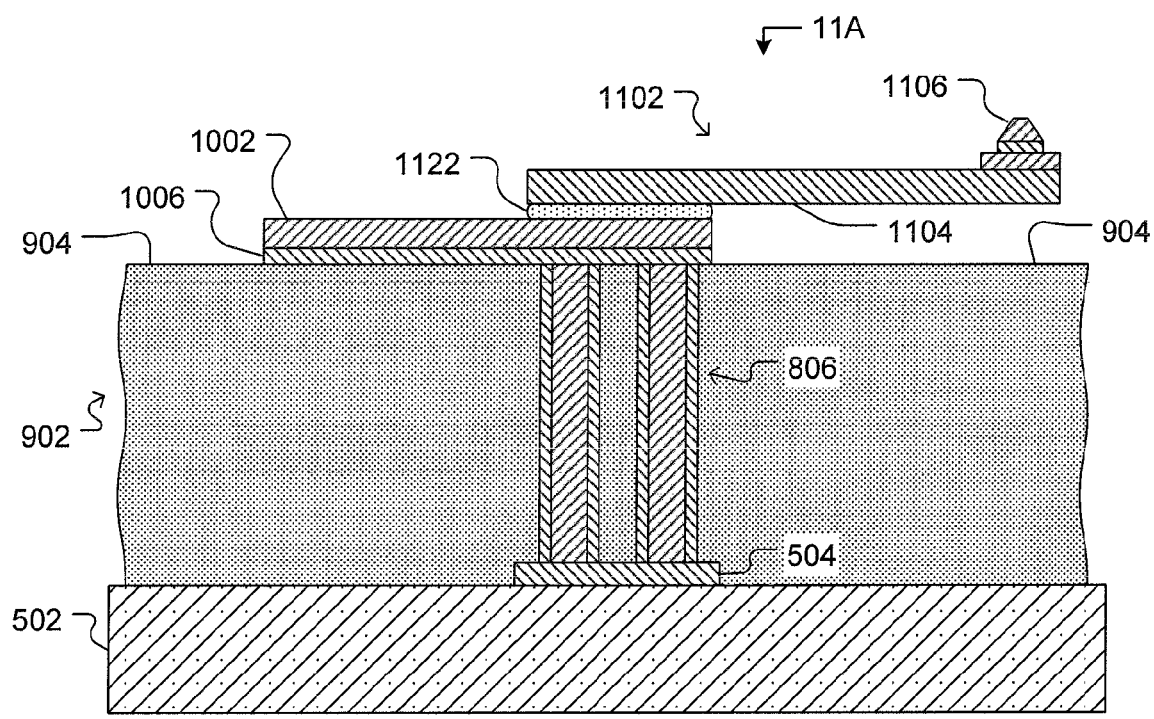
Figure 12A:
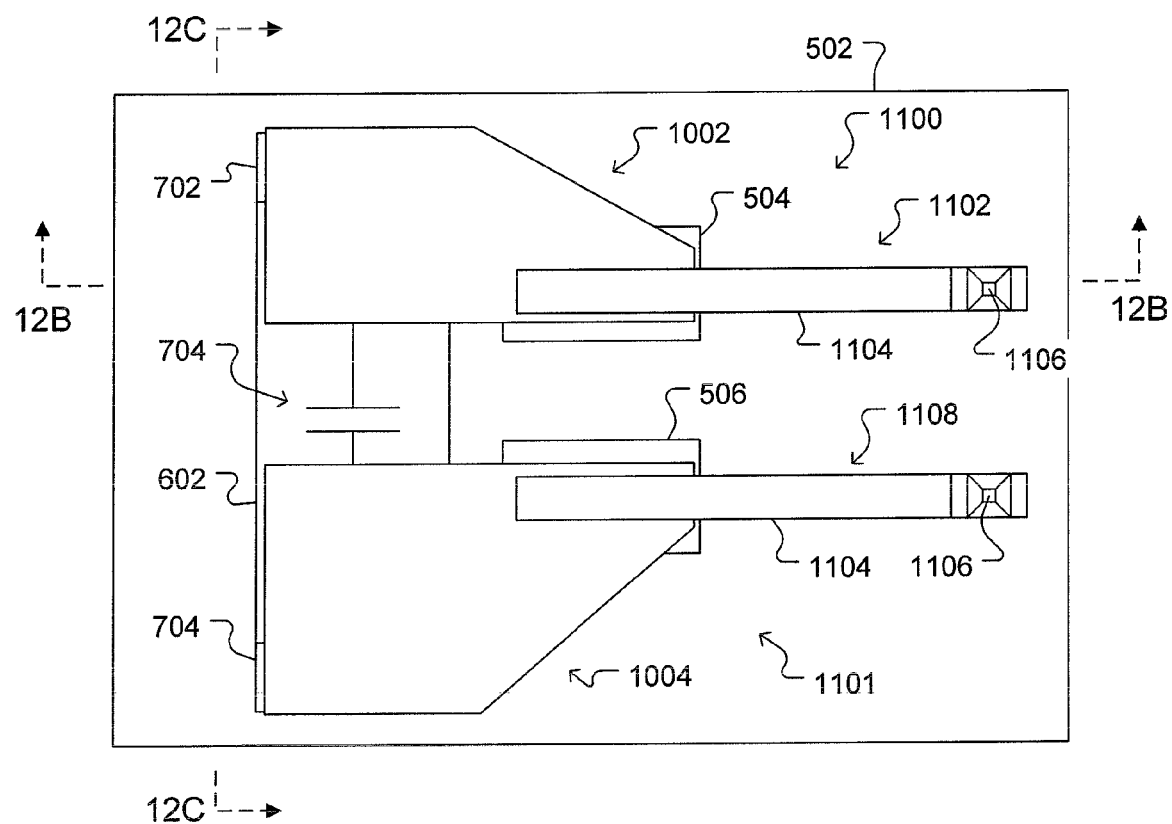
Figure 12B:
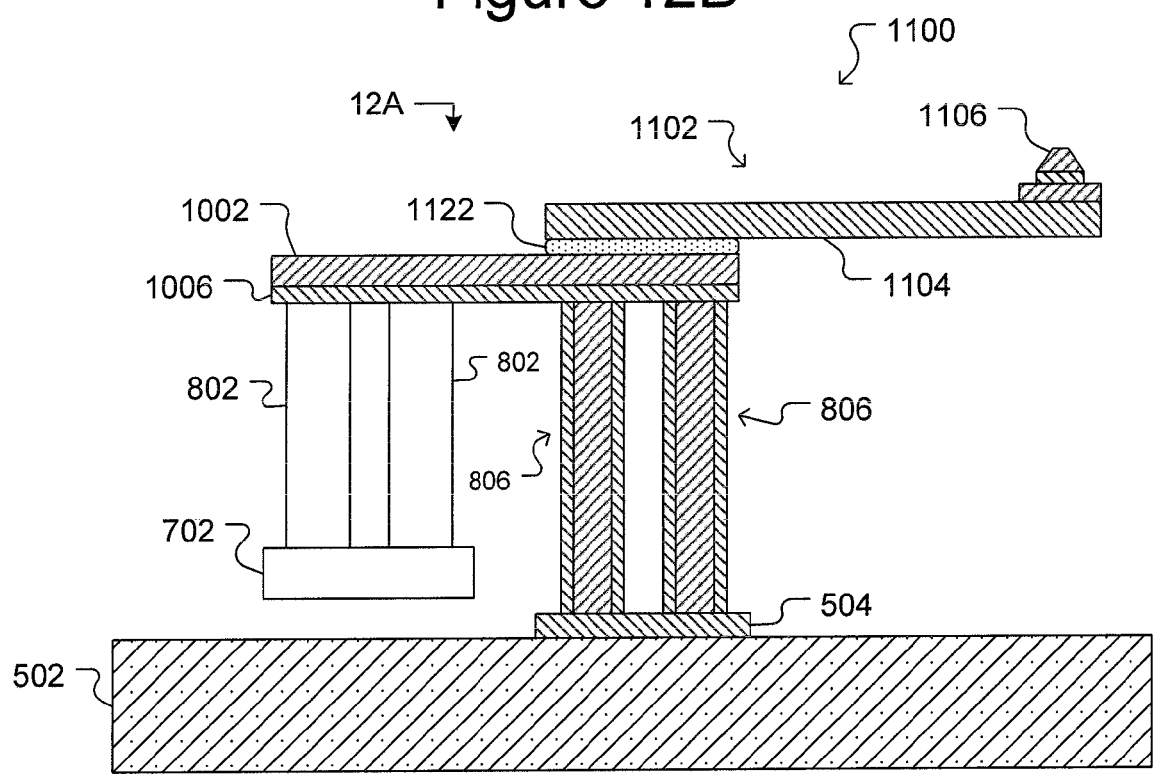
Figure 12C:
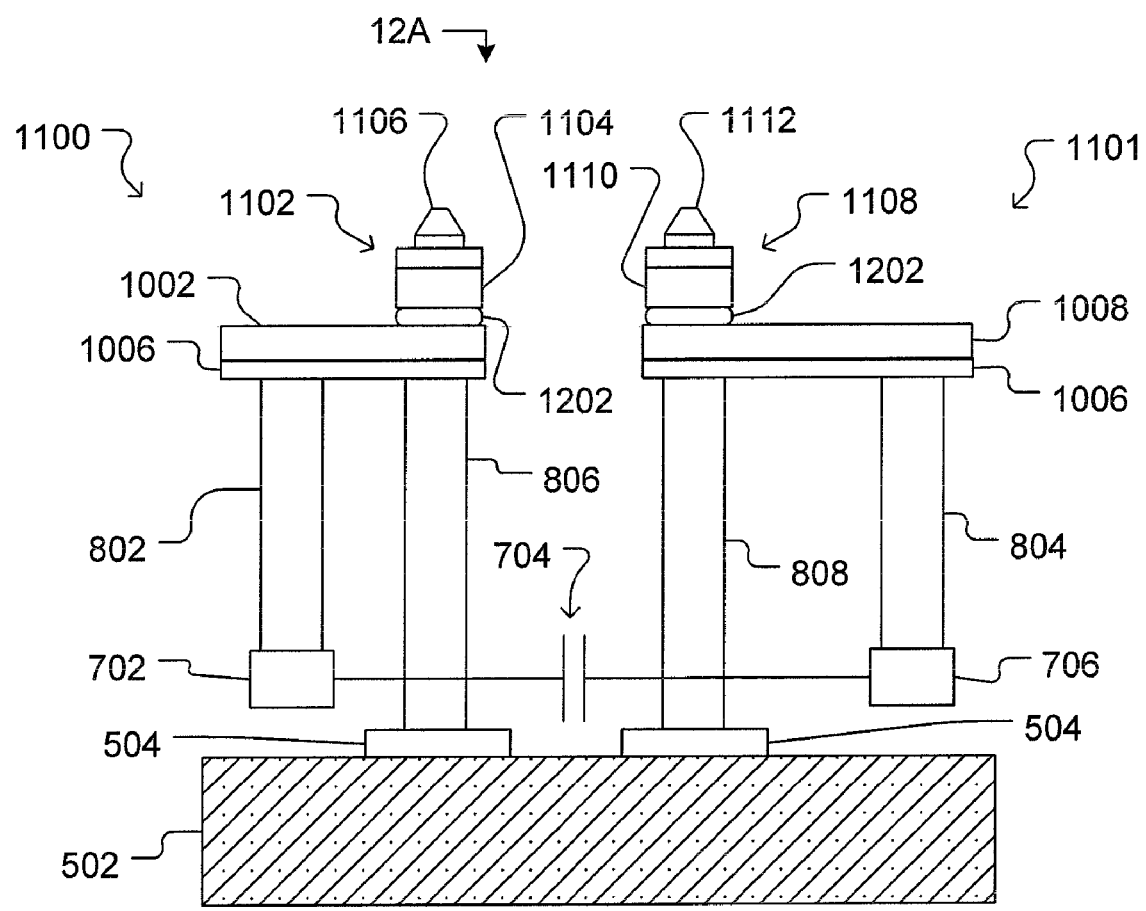

FIGS. 5A-12C illustrate an exemplary process for fabricating an electrical component, like electrical component 104 of FIG. 1, with the formation of two probe structures, each like probe structure 102 of FIG. 1, according to some embodiments of the invention. As will be seen, in the example shown in FIGS. 5A-12C, two probe structures 1100 and 1101 and a capacitor 704 (see FIGS. 12A-12C) can be fabricated on a substrate 502. As can be seen in FIGS. 12A-12C (which show the probe structures 1100, 1101 formed by the process of FIGS. 5A-12C), probe structure 110 can be electrically connected (through columns 806) to one terminal 504 of substrate 502, and probe structure 1101 can be electrically connected (through columns 808) to another terminal 506 of substrate 502. As can also be seen in FIGS. 12A-12C, capacitor 704 can electrically connect probe structure 1100 and probe structure 1101.

Probe structure 1100 can be connected through terminal 504 to a power source and can thus provide power (e.g., five volts) to a DUT 228, and probe structure 1101 can be connected through terminal 506 to ground (e.g., zero volts). Capacitor 704 can thus function as a decoupling capacitor, like decoupling capacitor 308 in FIG. 3. Nevertheless, an electrical component other than a capacitor 704 can be disposed between probe structures 1100, 1101 in place of or in addition to capacitor 704. For example, as discussed above, one or more electrical components such as a resistor, inductor, diode, transistor, driver circuit, integrated circuit, etc. can be formed in addition to or in place of capacitor 704.

Figure 5A:
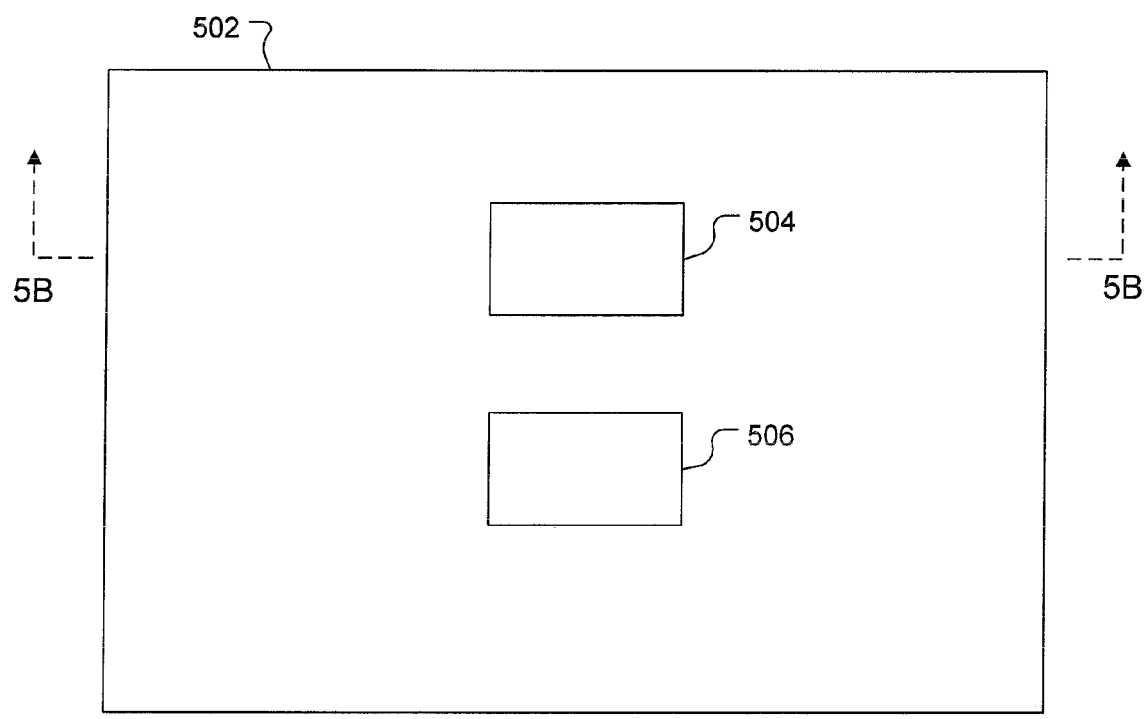
FIGS. 5A-12C illustrate an exemplary process in which probe structures are formed with a capacitor electrically connecting the probe structures according to some embodiments of the invention.
Figure 5B:
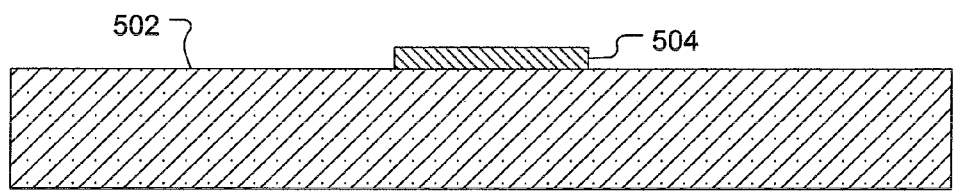

Referring now to FIGS. 5A and 5B, those figures show a top view and a cross-sectional side view, respectively, of the substrate 502 with terminals 504, 506. Substrate 502 can be like substrate 108 of FIG. 1, and terminals 504, 506 can be like terminal 106 of FIG. 1. For example, although not shown in FIGS. 5A and 5B, terminals 504, 506 can be electrically connected to other terminals (not shown) or electrical elements (not shown) on or in substrate 502. Traces and/or vias (e.g., like via 114 of FIG. 1) on or within substrate 502 can provide such connections, as generally discussed above with respect to terminal 106 of FIG. 1.

Figure 6A:
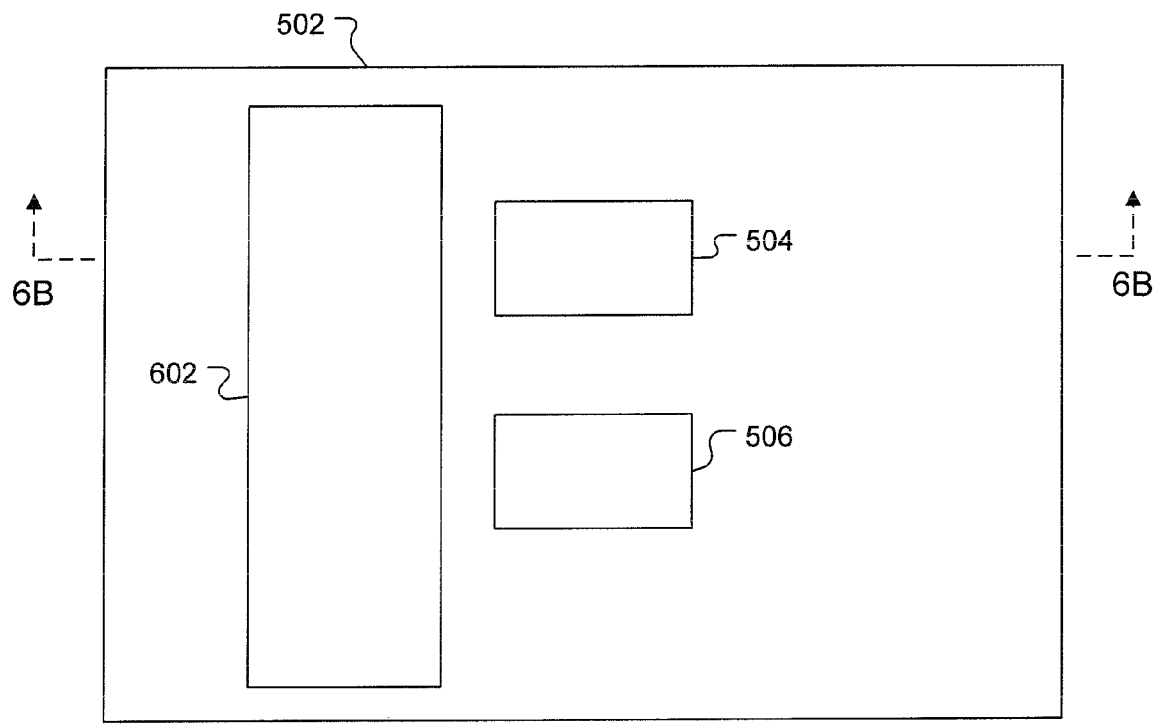
Figure 6B:
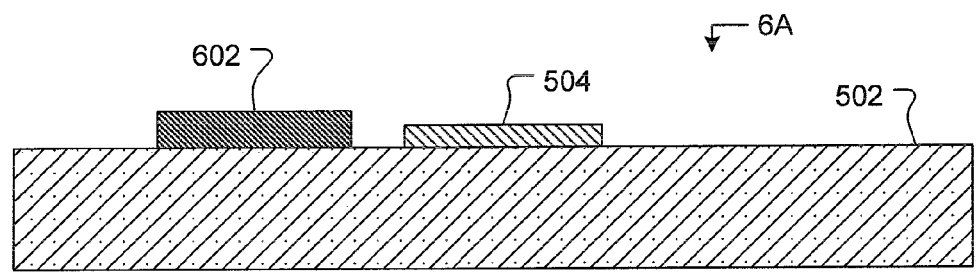

As shown in FIGS. 6A and 6B (which show top and side, cross-sectional views, respectively), a component base 602 can be formed on substrate 502 adjacent terminals 504, 506. As will be seen, component base 602 can provide a base on which capacitor 704 will fabricated or placed. Component base 602 can be any suitable material and can be deposited in any suitable manner. For example, component base 602 can comprise a photoresist material and can be deposited over all or most of the surface of substrate 502. The photoresist material can then be selectively exposed and a portion removed to leave the pattern shown in FIGS. 6A and 6B. Other non-limiting examples of materials that can form component base 602 include polyamides, organic materials, etc.

Figure 7A:
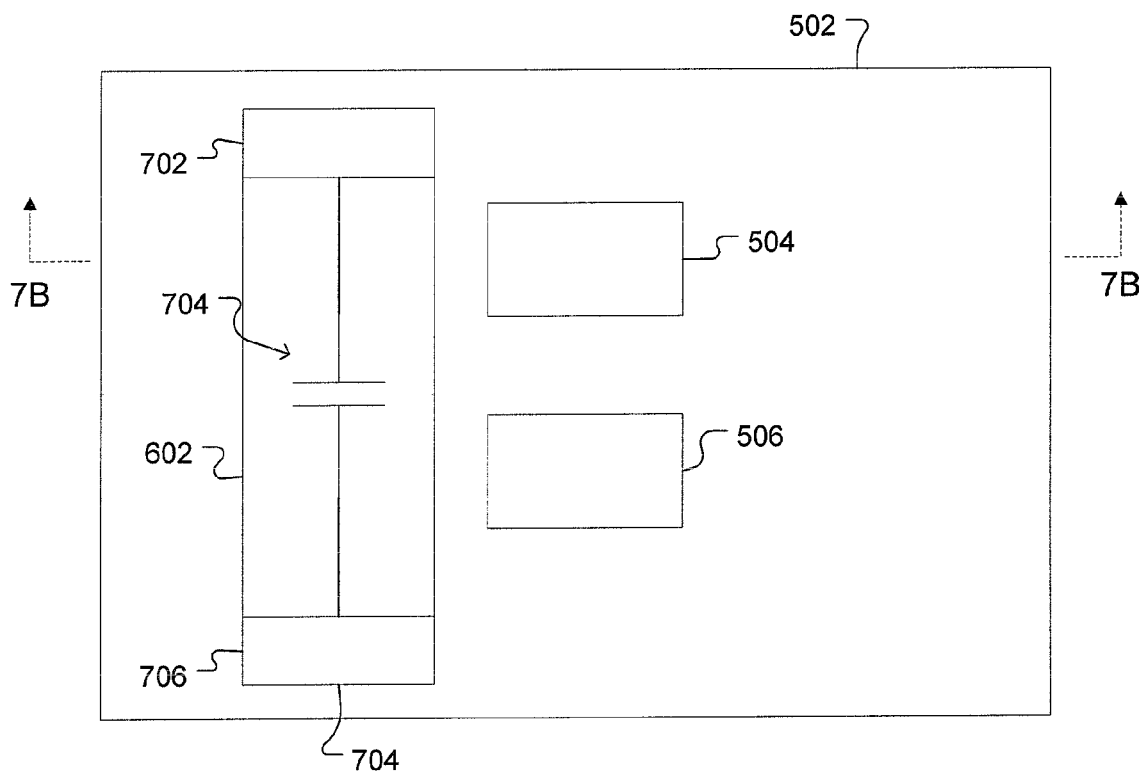
Figure 7B:
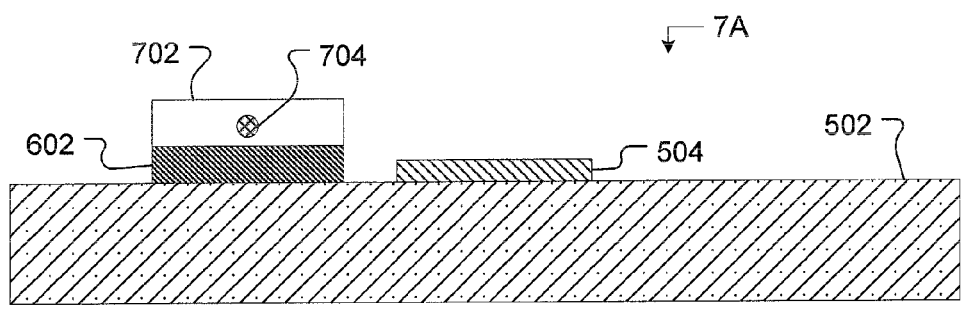

Next, as shown in FIGS. 7A and 7B, the capacitor 704 can be fabricated or placed on the component base 602. In FIGS. 7A and 7B, capacitor 704 is shown in schematic form. In practice, capacitor 704 can be a discrete circuit element that is placed on component base 602. Alternatively, capacitor 704 can be formed in a plurality of materials (e.g., two conductive layers forming parallel plates that are separated by a dielectric layer) deposited on component base 602. Moreover, a protective package (not shown) can be formed or provided around the capacitor 704.

As shown in FIGS. 7A and 7B, the capacitor 704 can be connected to electrically conductive bases 702, 706, which can be disposed on component base 602. For example, bases 702, 706 can be attached to or formed on component base 602. Bases 702, 706 can comprise electrically conductive material selectively electroplated or otherwise selectively deposited onto component base 602. As will be seen, bases 702, 706 can provide bases to which columns 802, 804 will be attached, and bases 702, 706 can electrically connect the capacitor 704 to the columns 802, 804. Alternatively, capacitor 704 can comprise a package (not shown) or other protective material that includes connection terminals (not shown), and columns 802, 804 can be attached to the package of capacitor 704 and electrically connected to the capacitor's connection terminals (not shown). In one example, such a package (not shown) can be formed around capacitor 704 after capacitor 704 is disposed on component base 602. Alternatively, such a package (not shown) can be part of capacitor 704 before capacitor 704 is disposed on component base 602.

Figure 8A:
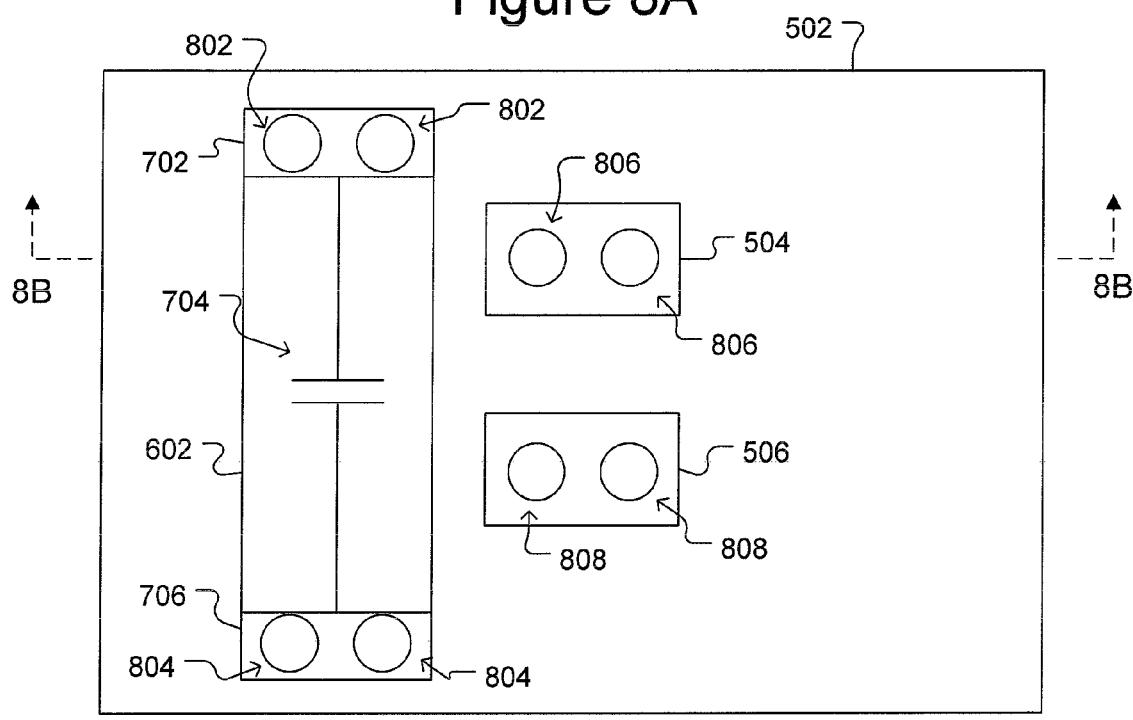
Figure 8B:
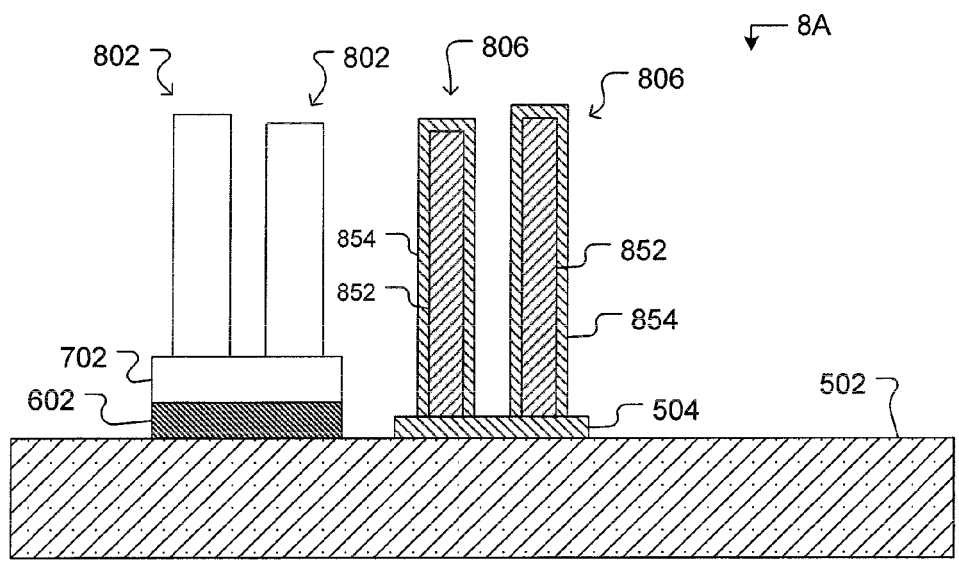

As shown in FIGS. 8A and 8B, support columns 802, 804, 806, 808 can be attached to bases 702, 706 and terminals 504, 506. As shown in part in FIG. 8B, support columns 802, 804, 806, 808 can comprise wires 852 bonded to bases 702, 706 and terminals 504, 506 using standard wiring bonding techniques. As also shown in part in FIG. 8B, the wires 852 that form support columns 802, 804, 806, 808 can comprise an over coat material 854. For example, support columns 802, 804, 806, 808 can be like column elements 102 in U.S. Patent Application Publication No. 2001/0012739. That is, support columns 802, 804, 806, 808 can comprise the same or similar materials as column elements 102 in U.S. Patent Application Publication No. 2001/0012739.

Columns 802, 804, 806, 808 need not comprise wires. For example, each column 802, 804, 806, 808 can comprise one or more post structures stacked one on top of another. Such post structures can be formed lithographically by, for example, depositing (e.g., by electroplating) material composing the post structures into openings in a masking material that define the shapes of the posts. For example, such posts can be like posts 2906 shown in FIGS. 30A and 30B and can be formed in lithographically patterned openings in a masking material, like masking layer 2904 of FIGS. 30A and 30B, as described below.

Figure 9A:
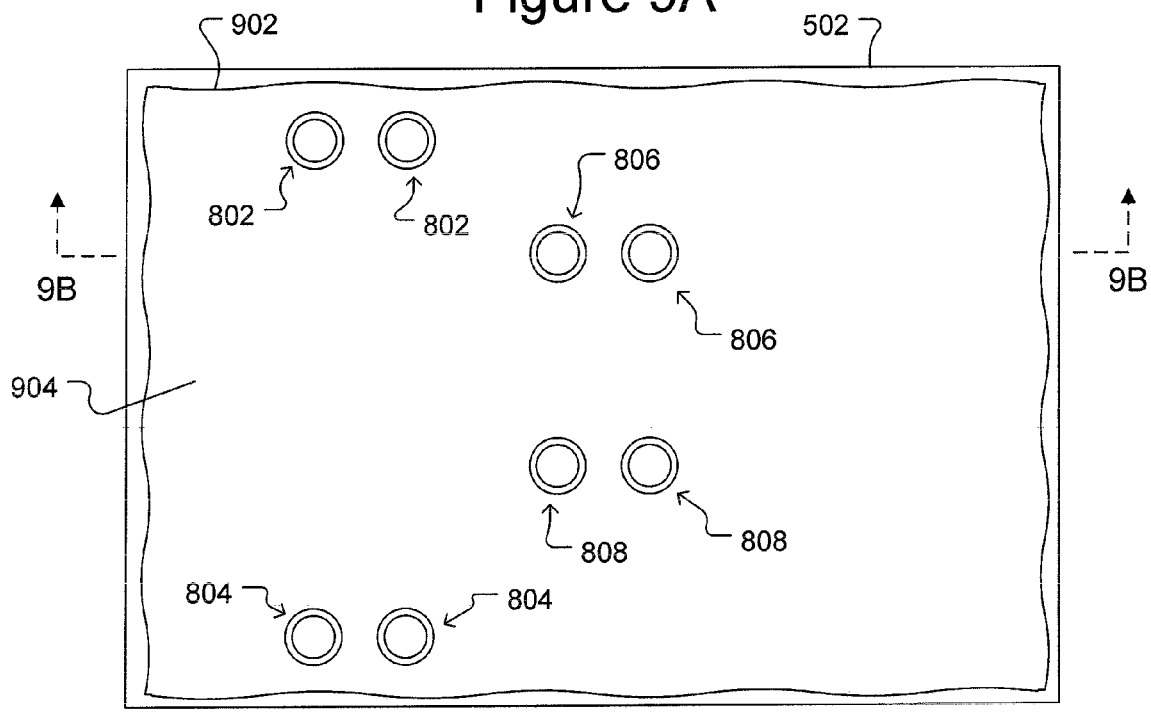
Figure 9B:
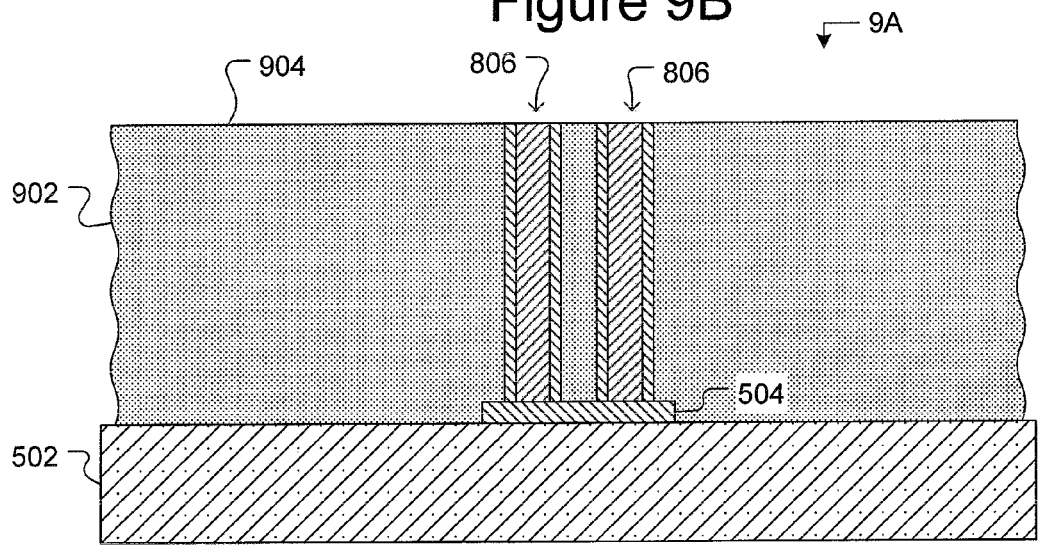

As best seen in FIG. 8B, columns 802, 804, 806, 808 can have irregular heights. That is, due to, for example, manufacturing imperfections, columns 802, 804, 806, 808 can extend different lengths from a surface of substrate 502. The columns 802, 804, 806, 808 can be planarized so that columns 802, 804, 806, 808 extend approximately the same length (within acceptable tolerances) from a surface of substrate 502. FIGS. 9A and 9B show an exemplary way of planarizing columns 802, 804, 806, 808. As shown, an encapsulant 902 can be disposed on substrate 502 around columns 802, 804, 806, 808. An outer surface 904 of the encapsulant 902 can then be planarized along with end portions of columns 802, 804, 806, 808. Non-limiting examples of suitable encapsulants 902 include under fill materials, epoxy molding compounds, glob-top materials, and materials designed for casting and lapping. Non-limiting examples of methods of planarizing surface 904 include mechanical grinding methods including without limitation use of a diamond based grinding tool or a silicon-carbide based grinding tool. Other non-limiting examples of methods of planarizing surface 904 include chemical-mechanical methods including without limitation use of slurries (e.g., slurries of silicon dioxide, aluminum oxide, cesium oxide, etc.) or electric discharge machines.

Figure 10A:
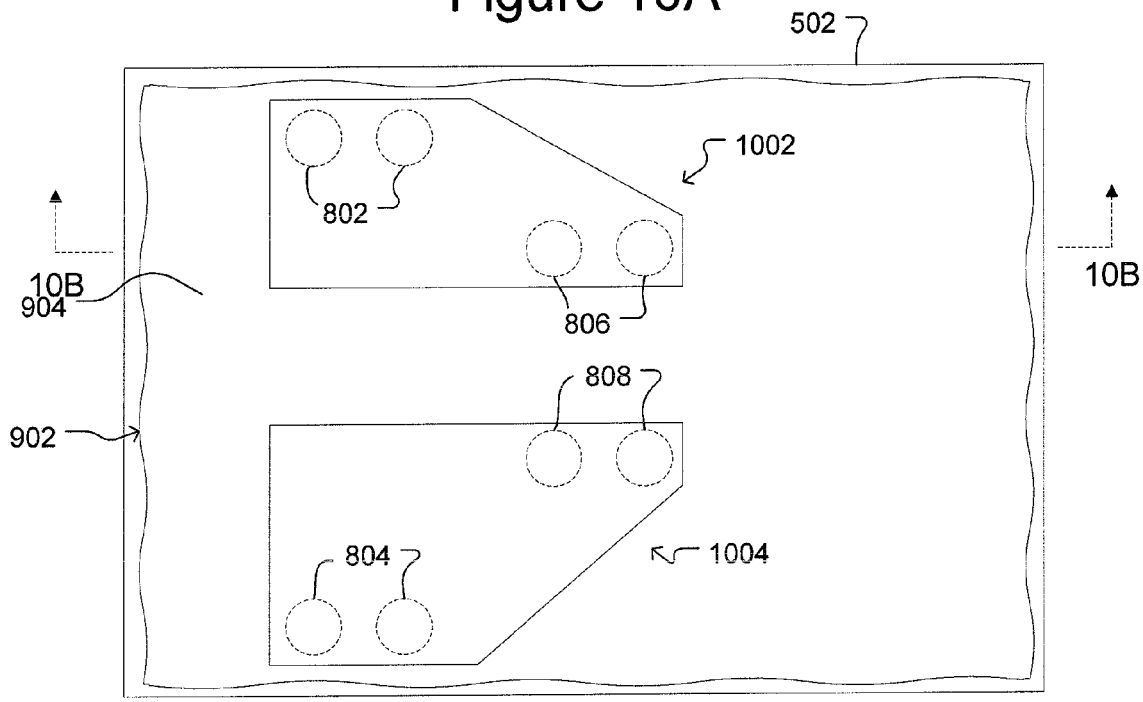
Figure 10B:
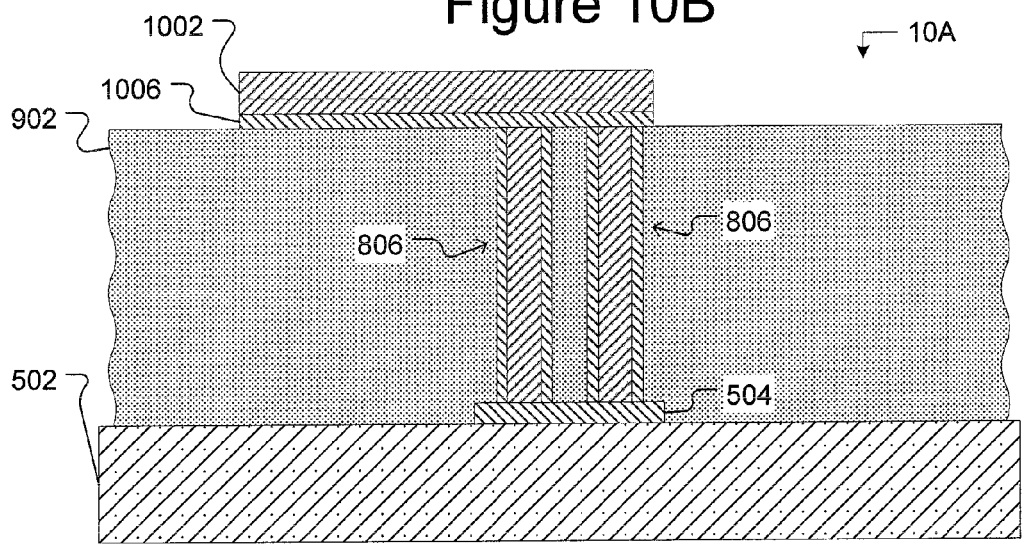

As shown in FIGS. 10A and 10B, tie bars 1002, 1004 (e.g., scaffolding) can be formed on or attached to ends of columns 802, 804, 806, 808. (Although hidden by tie bars 1002, 1004 and therefore not visible in FIG. 10A, columns 802, 804, 806, 808 are nevertheless shown in FIG. 10A in dashed lines.) As shown, one of the tie bars 1002 can be formed on or attached to ends of columns 802, 806, and another of the tie bars 1004 can be formed on or attached to ends of columns 804, 808. Tie bars 1002, 1004 can be electrically conductive and can thus comprise conductive material. Thus, among other things, tie bar 1002 can electrically connect columns 802 to columns 806, and tie bar 1004 can electrically connect columns 804 to columns 808.

Tie bars 1002, 1004 can be formed in any suitable manner. As one example, material or materials forming tie bars 1002, 1004 can be electroplated onto a seed layer 1006 (e.g., a thin layer of an electrically conductive material) deposited onto surface 904 of encapsulant 902. Seed layer 1006 can be deposited over all or most of surface 904, and a layer of a patternable masking material (e.g., a photoresist material) (not shown) can be deposited over the seed layer 1008 and pattern to have openings (not shown) through to the seed layer 1008. The openings can be in locations where tie bars 1002, 1004 are to be formed and can be shaped in the desired shapes of tie bars 1002, 1004. In an electroplating operation, material or materials forming tie bars 1002 will plate only onto the exposed areas of seed layer 1006, which as described above, correspond to the openings (not shown) in the patternable masking material (not shown). The patternable masking material (not shown) can then be removed, and all of the exposed portions of the seed layer 1008, which are all portions of the seed layer not covered by tie bars 1002, 1004, can also be removed. As another option, seed layer 1006 can be deposited onto surface 904 of the encapsulant 902 only in locations where tie bars 1002, 1004 are to be formed, and in the desired shapes of tie bars 1002, 1004. This can be accomplished by depositing seed layer 1006 through a patterned mask (not shown), by depositing seed layer 1006 over all or most of surface 904 of encapsulant 902 and then removing selected portions of the seed layer 1006, or any other suitable method. The material or materials that form tie bars 1002, 1004 can then be electroplated onto the seed layer 1006. Seed layer 1006 can comprise any electrically conductive material (e.g., copper, palladium, titanium, tungsten, silver, gold, and their alloys) and can be deposited using any suitable deposition method (e.g., chemical vapor deposition, physical vapor deposition, sputter deposition, electron beam deposition, thermal evaporation, etc.).

Tie bars 1002, 1004 need not be formed by electroplating material onto a seed layer 1006. For example, material or materials forming tie bars 1002, 1004 can be deposited on surface 904 of encapsulant 902 by chemical vapor deposition, physical vapor deposition, sputter deposition, electron beam deposition, thermal evaporation, etc. without the need for a seed layer 1006. Moreover, the material or materials that form tie bars 1002, 1004 can be deposited through a patterned mask (patterned in the desired shape of the tie bars 1002, 1004).

Alternatively, the material or materials that form tie bars 1002, 1004 can be deposited as a blanket layer over surface 904 of encapsulant 902, and the blanket layer can then be patterned by removing portions of the blanket layer, leaving tie bars 1002, 1004. Still other examples of methods for forming tie bars 1002, 1004 include prefabricating the tie bars 1002, 1004 and then attaching the prefabricated tie bars 1002, 1004 to ends of columns 802, 804, 806, 808. For example, tie bars 1002, 1004 can be stamped from sheet metal, electroformed, formed in molds and released, etc. and then attached to the ends of columns 802, 804, 806, 808. Tie bars 1002, 1004 can be attached to ends of columns 802, 804, 806, 808 by solder, brazing, the use of any adhesive material, etc. Moreover, the shapes of the tie bars 1002, 1004 shown in FIGS. 10A and 10B are exemplary only, and the tie bars 1002, 1004 can take many different shapes.

As yet another alternative, the structure comprising the tie bars 1002, 1004, columns 802, 804, 806, 808, electronic component 704, and conductive bases 702 can alternatively be first formed on another substrate (e.g., a sacrificial or removable substrate), then attached to the substrate 502, and then released from the other substrate (not shown). For example, as an alternative to the process illustrated in FIGS. 5A-10B, tie bars 1002, 1004 can be formed on a surface of the other substrate (not shown) and columns 802, 804, 806, 808 can be attached to the tie bars 1002, 1004. The electronic component 704 and conductive bases 702 can then be formed on or attached to the columns 802, 804. Ends of the columns 806, 808 that extend away from the tie bars 1002, 1004 can then be attached to terminals 504, 506 of the substrate 502, which yields the structure shown in FIGS. 10A and 10B but without the encapsulant 902.

As shown in FIGS. 11A and 11B, probes 1102, 1708 can be attached to tie bars 1002, 1004. For example, probe 1102 can be attached to tie bar 1002, and probe 1108 can be attached to tie bar 1004. In the example shown in FIGS. 11A and 11B, probes 1102, 1108 can be soldered 1122 to tie bars 1002, 1004. For example, solder 1122 can be applied directly to only the tie bars 1002, 1004; directly to only the probes 1102, 1108; or directly to both the tie bars 1002, 1004 and the probes 1102, 1108. Other methods of attaching probes 1102, 1108 to tie bars 1002, 1004 can, however, be used. For example, probes 1102, 1108 can be brazed to tie bars 1002, 1004. As another example, an adhesive can be used to attach probes 1102, 1108 to tie bars 1002, 1004. As yet another example, probes 1102, 1108 can be fabricated on tie bars 1002, 1004.

Although the exemplary probes 1102, 1108 shown in FIGS. 11A and 11B comprise a beam 1104 and a tip 1106, other types of probes can alternatively be attached to or fabricated on tie bars 1002, 1004. For example, probes 1102, 1108 can be any of the types of probes discussed above with respect to probe structure 102.

As shown in FIGS. 12A-12C, encapsulant 902 can be removed. As also shown, component base 602 can also be removed. For example, if component base 602 comprises a photoresist material, the photoresist material can be removed using know processes for removing photoresist materials. The result can be two probe structures 1100, 1101 electrically connected by capacitor 704. As shown, probe structure 1100 includes probe 1102 attached to tie bar 1002, which is attached to both columns 802 and column 806. Because columns 806 are attached to terminal 504 of substrate 502 and columns 802 are attached to a first end of capacitor 704, probe structure 1100 is thus electrically connected to terminal 504 of substrate 502 and the first end of capacitor 704. Probe structure 1101 includes probe 1108 attached to tie bar 1004, which is attached to both columns 804 and column 808. Because columns 808 are attached to terminal 506 of substrate 502 and columns 804 are attached to a second end of capacitor 704, probe structure 1101 is thus electrically connected to terminal 506 of substrate 502 and the second end of capacitor 704. Although not shown in FIGS. 12A-12C, component base 602 need not be removed from substrate 502 but can be left in place on substrate 502.

Many probe structures like or similar to probe structures 1100, 1101 as well other probe structures can be made on or attached to substrate 502, which can then be used as a probe substrate 224 in a probe card assembly like probe card assembly 200 of FIG. 2. Referring to FIGS. 2, 12A, 12B, and 12C, as one example, terminal 504 of probe substrate 502 can be electrically connected through a spring interconnect 219, an electrical path (not shown) through interposer substrate 208, a spring interconnect 206, and an electrical path (not shown) through wiring substrate 202 to a portion of a connector 204 that receives a power signal. Terminal 506 can similarly be electrically connected through probe card assembly 200 to a portion of connector 204 that receives a ground signal. Capacitor 704 can thus function as a decoupling capacitor, like capacitor 308 of FIG. 3, filtering high frequency noise from the power signal provided to terminal 504. As mentioned above, in some embodiments, parasitic effects (e.g., parasitic capacitance) can be reduced or eliminated by locating the decoupling capacitor 704 close to the contact tips 1106. In fact, generally speaking, the closer the capacitor 704 is located to the contact tips 1106, the less the parasitic effects.

Although two probe structures 1100, 1101 and one capacitor 704 are formed in the exemplary process shown in FIGS. 4A-12C, more or fewer probe structures 1100, 1100 can be formed, and more capacitors 704 can be formed. In addition, the probe structures 1100, 1101 can be electrically connected to the one or more capacitors 704 in any of many connection configurations. Moreover, capacitor 704 can be replaced by one or more other electronic components, including without limitation, a resistor, diode, transistor, driver circuit, active electronic circuit, integrated circuit, inductor, etc. Moreover, the electronic component can be formed in a variety of shapes and sizes.

Figure 13A:
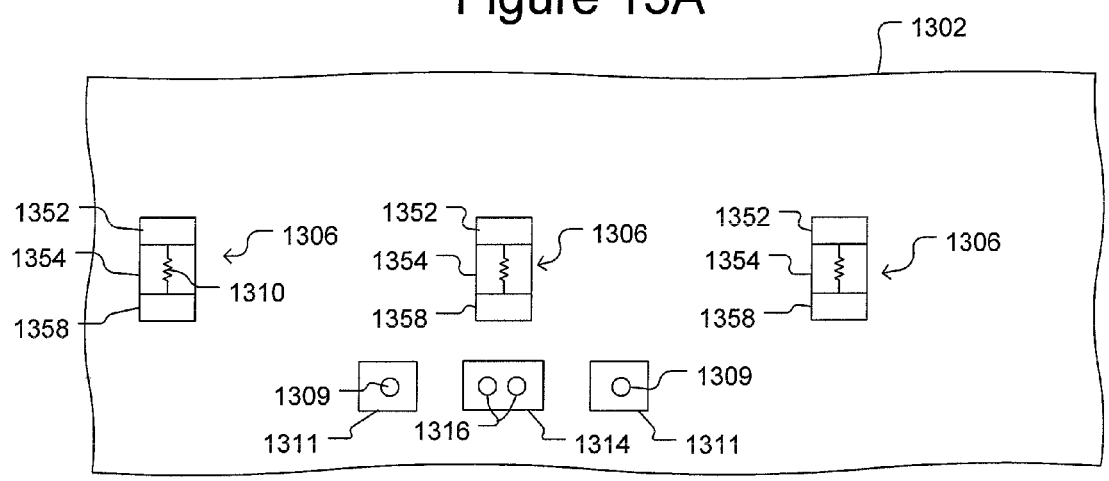
FIGS. 13A-13E illustrate an exemplary process In which a tie bar electrically connecting a terminal to a plurality of probes is formed with isolation resistors according to some embodiments of the invention.
Figure 13B:
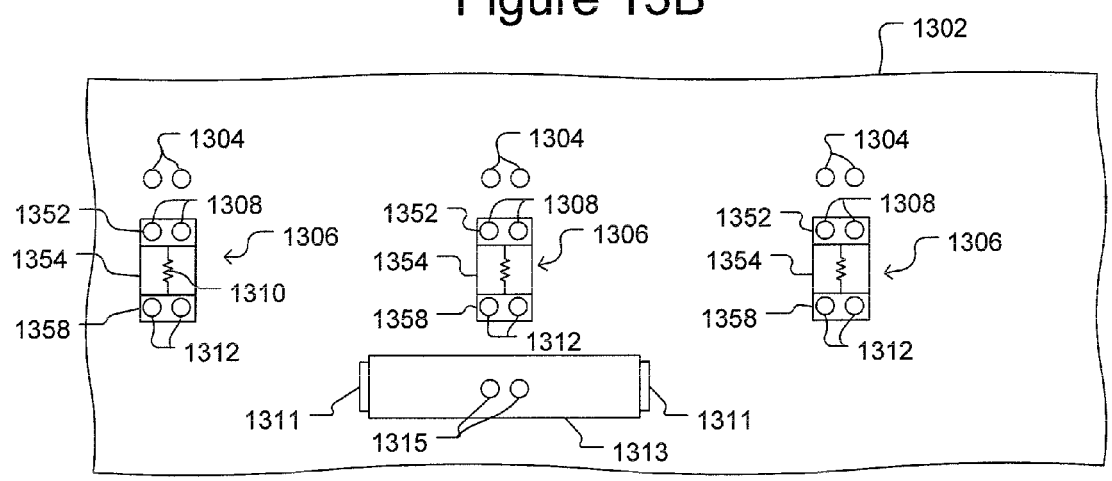
Figure 13C:
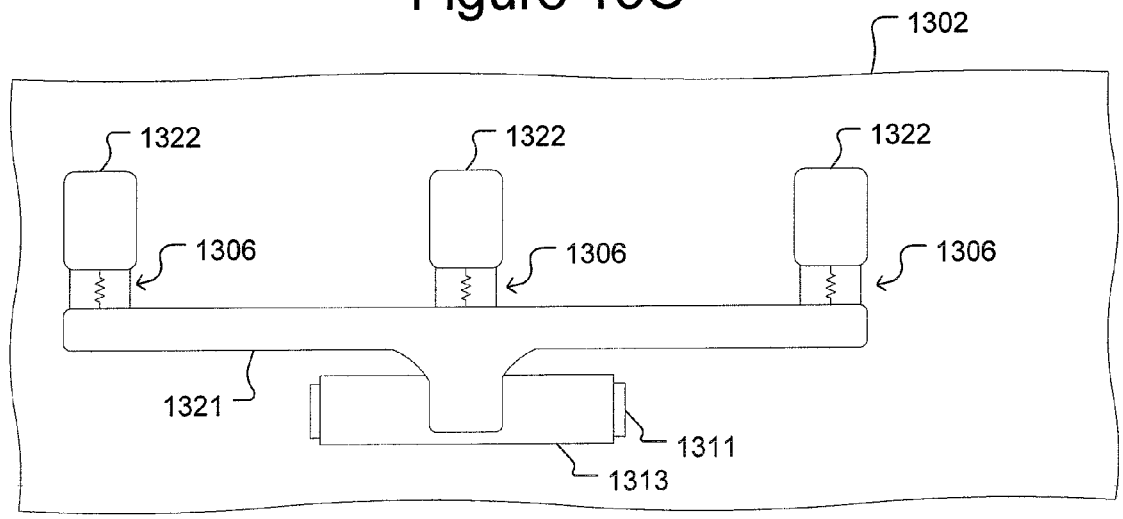
Figure 13D:
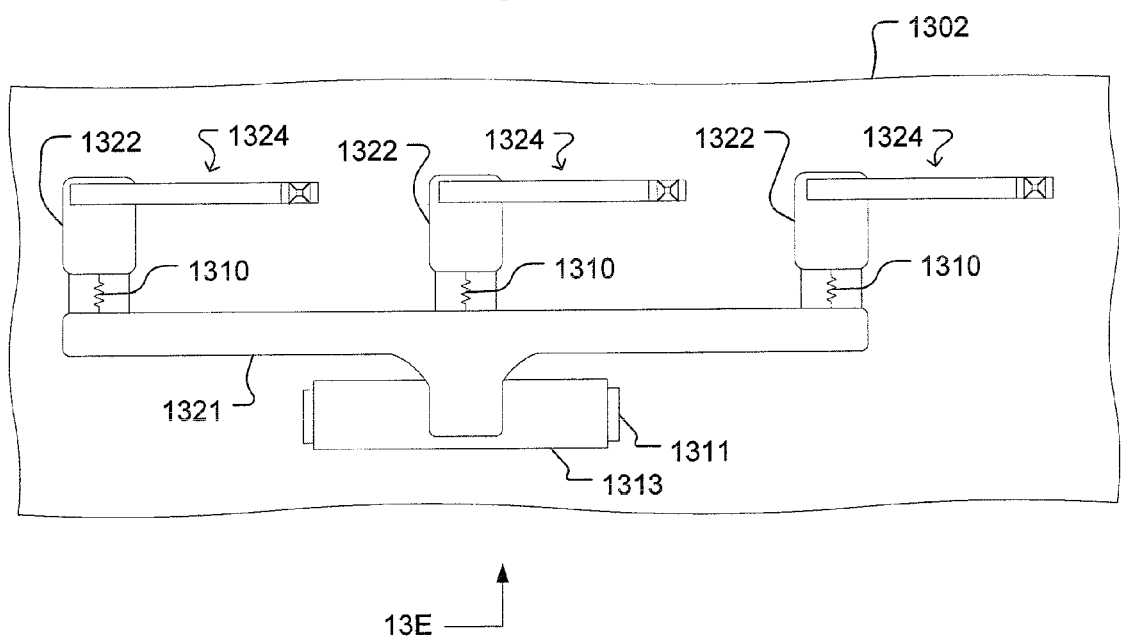
Figure 13E:
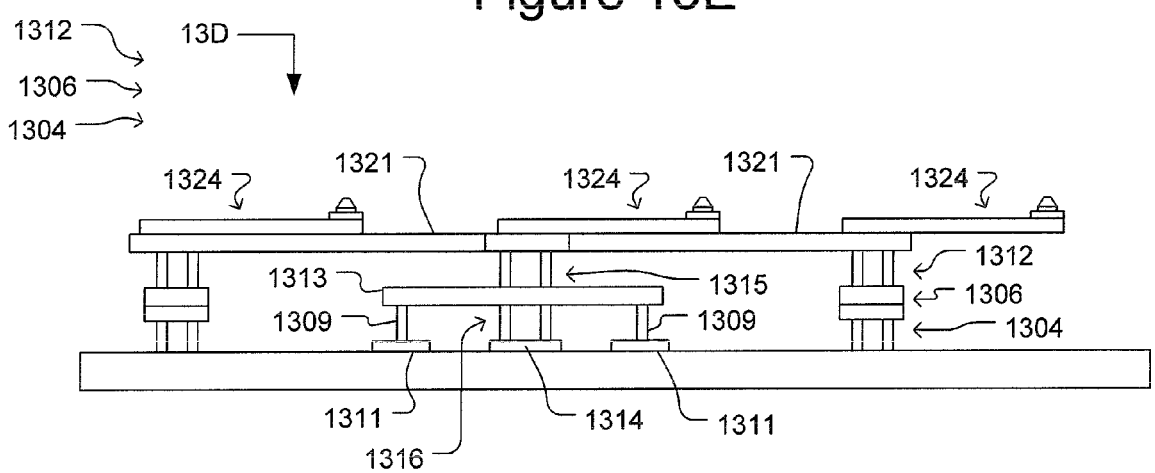

FIGS. 13A-13E illustrate another exemplary process for fabricating an electrical component, like electrical component 104 of FIG. 1, integrally with the formation of probe structures, like probe structure 102 of FIG. 1, according to some embodiments of the invention. As will be seen, the resulting configuration, which is shown in FIGS. 13D and 13E, can implement an electrical configuration like the configuration shown in FIG. 4 except that a driver circuit 1313 can also be fabricated with or attached to a structure that includes the probes 1324. That is, a signal received at terminal 1314 of substrate 1302 in FIGS. 13D and 13E can be received by driver circuit 1313 and output through resistor structures 1306 to one or more probes 1324 (three probes 1324 are shown but more or fewer can be used).

As shown in FIG. 13A, electrically conductive support columns 1316 can be attached to an electrically conductive signal terminal 1314 of a substrate 1302. Substrate 1302 can be like substrate 502 (see FIGS. 5A and 5B), and terminal 1314 can be like either of terminals 504, 506 of substrate 502. Moreover, terminal 1314 can be electrically connected to another terminal (not shown) or electrical element (not shown) on or in substrate 1302 as discussed above with respect to terminals 504, 506 of FIGS. 5A and 5B. As also shown, electrically conductive support columns 1309 can be attached to power and ground terminals 1311. Columns 1309, 1316 can be like columns 806 of FIGS. 8A and 8B and can be attached to terminal 1311, 1314 in the same way that columns 806 are attached to terminal 504 of substrate 502.

As also shown in FIG. 13A, resistors structures 1306 can be disposed on substrate 1302. (Three resistor structures 1306 are shown but more or fewer can be used in other implementations.) Each resistor structure 1306 can include a component base 1354, column bases 1352, 1358, and a resistor 1310. Component base 1354 can be like component base 602 of FIGS. 6A and 6B, and column bases 1352, 1358 can be like column bases 702, 706 of FIGS. 7A and 7B. Moreover, resistor 1310 can be disposed on component base 1354 and electrically connected to column bases 1352, 1358 in the same way that capacitor 704 is disposed or fabricated on component base 602 and electrically connected to bases 702, 706 in FIGS. 7A and 7B. For example, resistor 1310 can be fabricated on base 1354 or can be separately fabricated as a discrete resistor and attached (e.g., soldered) to base 1354.

As shown in FIG. 13B, a driver circuit 1313 (e.g., in the form of an integrated circuit) can be attached (e.g., by soldering) to or formed on columns 1309, 1316. The columns 1309 can be electrically connected to power and ground inputs of the driver circuit 1313, and columns 1316 can be electrically connected to an input of the driver circuit 1313. As also shown in FIG. 13B, electrically conductive columns 1308, 1312 can be attached to column bases 1352, 1358 and electrically connected to a resistor 1310. Resistor 1310 can be disposed on component base 1354 and electrically connected to column bases 1352, 1358 in the same way that capacitor 704 is disposed or fabricated on component base 602 and electrically connected to bases 702, 706 in FIGS. 7A and 7B. Electrically conductive columns 1315 can also be attached to the driver circuit 1313 and electrically connected to the output of the driver circuit 1313. Columns 1308, 1312, 1315 can be like columns 802 in FIGS. 8A and 8B, and columns 1312 can be like columns 804 in FIGS. 8A and 8B.

As also shown in FIG. 13B, sets of columns 1304 can be attached to substrate 1302. Again, three sets of columns 1304 are shown but more or fewer can be used in other implementations. Columns 1304 can be like any of columns 802, 804, 806, 808 in FIGS. 8A and 8B. Moreover, although not shown in FIG. 13B, an encapsulant like encapsulant 902 in FIGS. 9A and 9B can be deposited on substrate 1302 to encapsulate columns 1304, 1308, 1312, 1315. As discussed above with respect to encapsulant 902, a surface of the encapsulant (not shown in FIG. 13B) can be planarized, which can also planarize ends of columns 1304, 1308, 1312, 1315.

Next, as shown in FIG. 13C, electrically conductive tie bars 1321, 1322 can be made on or attached to ends of columns 1304, 1308, 1312, 1315. As shown, tie bar 1321 can be disposed on ends of columns 1315 and 1312 and therefore can electrically connect columns 1315 (which are attached and electrically connected to the output of driver 1313) to each of columns 1312. Because each set of columns 1312 is electrically connected to a first side of one of resistors 1310, tie bar 1321 can thus electrically connect the output of driver circuit 1313 to a first side of each of resistors 1310. Each of tie bars 1322 can be disposed on ends of a set of columns 1308 and a set of columns 1304 and can thus be electrically connected to the second end of resistors 1310. Tie bars 1321, 1322 can be like tie bars 1002, 1004 in FIGS. 10A and 10B and can be fabricated or attached like tie bars 1002, 1004.

As shown in FIG. 13D, electrically conductive probes 1324 can be attached to each of tie bars 1322. Probes 1324 can be like probes 1102, 1108 in FIGS. 11A and 11B and can be attached to or fabricated on tie bars 1322 in the same way that probes 1102, 1108 are attached to or fabricated on tie bars 1002, 1004.

The resulting structure shown in FIGS. 13D and 13E thus includes a driver circuit 1313 that receives a signal (e.g., test data received from a tester (not shown)) through terminal 1314 that is input into driver 1313. Driver 1313 can thus drive the signal through a plurality of resistors 1310 to a plurality of probes 1324. Many such structures as well other probe structures can be made on or attached to substrate 1302, which can then be used as a probe substrate 224 in a probe card assembly like the probe card assembly 200 of FIG. 2. For example, terminal 1314 of probe substrate 1302 can be electrically connected through a spring interconnect 219, an electrical path (not shown) through interposer substrate 208, a spring interconnect 206, and an electrical path (not shown) through wiring substrate 202 to a portion of a connector 204 that receives test data for one input terminal (not shown) of one DUT (not shown). The structure shown in FIGS. 13D and 13E can distribute that test data through probes 1324 to the input terminals (not shown) of three DUTs (not shown). Of course in other implementations, the test data can be distributed to more or fewer DUTs (not shown). Resistors 1310 can thus function as isolation resistors, like isolation resistors 412 in FIG. 4, and driver circuit 1313 can function like driver 402 in FIG. 4, except that driver 1313 can be located closer to the resistors 412 (e.g., between the connector 204 and branches 406).

It should be noted that, as shown in FIGS. 13D and 13E, tie bar 1321 ran be used as a distribution signal layer to distribute a signal received at a first location (e.g., terminal 1314) on substrate 1302 to one or more other locations (e.g., probes 1324) on substrate 1302. Additional such tie bars (like 1321) can be used to so distribute other signals.

Although one terminal 1314 is connected to one driver circuit 1313, which drives a signal through three resistors 1310 to three probes 1324 in the example shown in FIGS. 13A-13E, the driver circuit 1313 can alternatively be connected through more than or less than three resistors 1310 to more than or less than three probes 1324. Moreover, resistors 1310 can be replaced by one or more other electronic components, including without limitation, a capacitor, diode, transistor, driver circuit, active electronic circuit, integrated circuit, inductor, etc.

The exemplary processes shown in FIGS. 5A-12C and 13A-13E can be combined. For example, one or more structures like the structure shown in FIGS. 12A-12C and one or more structures like the structure shown in FIGS. 13D and 13E can be formed on the same substrate (e.g., a substrate like substrate 502). In fact, still other processes (not shown) can also be used to create still other structures (e.g., probes) on the substrate, and such a substrate can be used as the probe substrate 224 in a probe card assembly like probe card assembly 200 of FIG. 2.

FIGS. 14A-24 illustrate an exemplary process for fabricating an electronic component (e.g., resistors, capacitors, inductors, diodes, driver circuits, transistors, integrated circuits, etc.) and a plurality of probes, ones of which can be electrically connected to the electronic component according to some embodiments of the invention. Before discussing the process, however, it may be helpful to provide an overview description of an example of a finished electronic component and probes, shown in FIGS. 23A, 23B and 24.

Figure 23A:
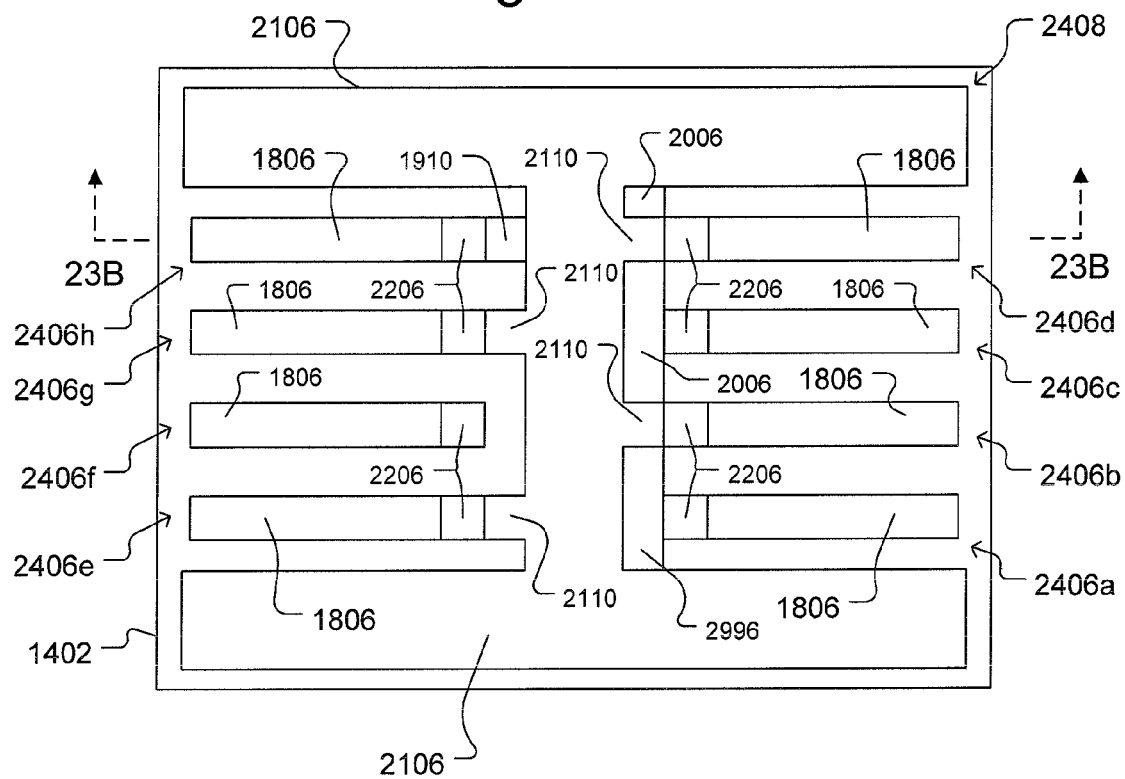
Figure 23B:
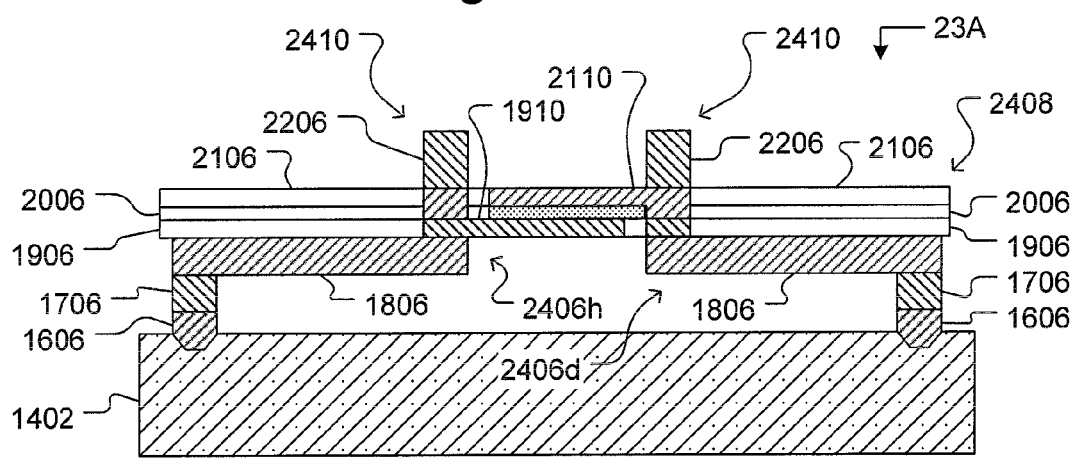
Figure 24:
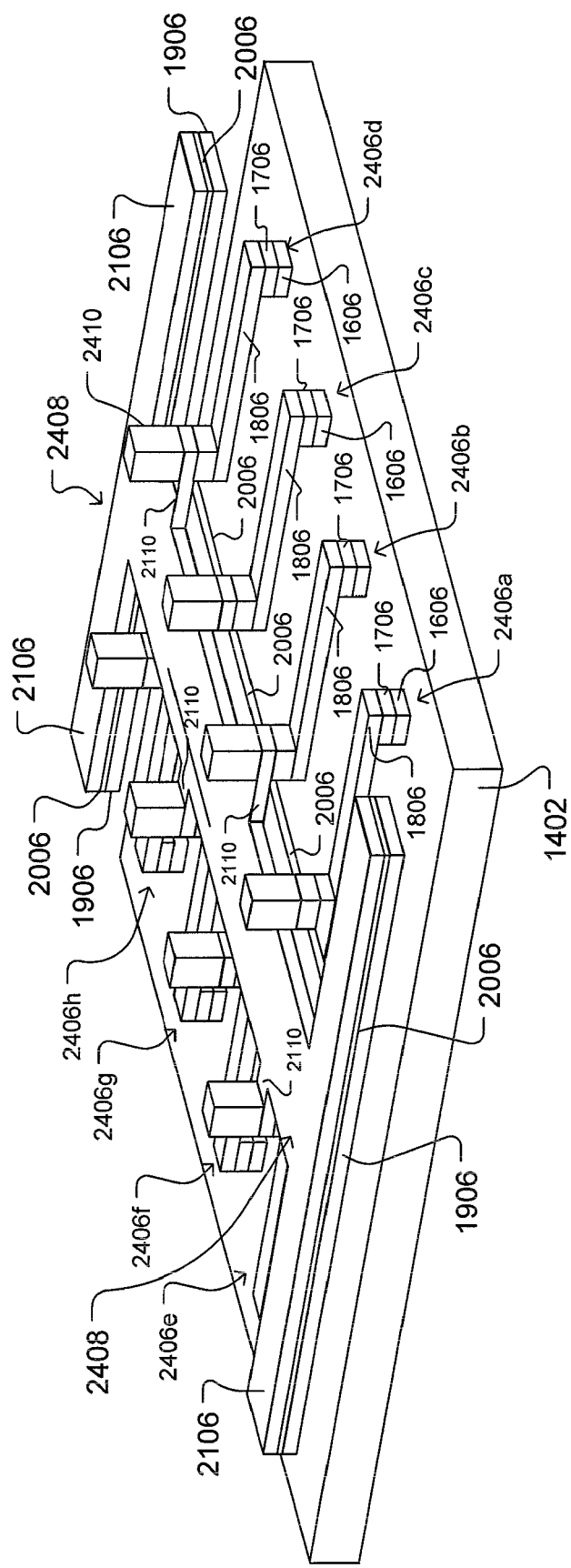
FIG. 24 illustrates an elevated, perspective view of the probes and capacitor on the sacrificial substrate formed by the process of FIGS. 14A-23B.

FIG. 23A shows a top view, FIG. 23B shows a side, cross-sectional view, and FIG. 24 shows a perspective view an exemplary finished capacitor 2408 (which is an example of just one type of electronic component) and probes 2406a-h disposed on a sacrificial substrate 1402. (Herein, the term "sacrificial substrate" refers to any sacrificial or removable substrate.) As shown, the capacitor 2408 can comprise generally parallel, electrically conductive plates 1906, 2106 and a dielectric material 2006 can be disposed between the plates 1906, 2106. As also shown, each probe 2406*a-h* can comprise a tip 1606 (which is shown in FIG. 24 attached to the sacrificial substrate 1402), a base 1706, a beam 1806, and a post structure 2410, which as will be seen, can comprise a post and one or more spacer elements. The probes 2406*a-h* can be electrically conductive and can be attached to one of the plates 1906, 2106 of the capacitor 2408. In the example shown in FIG. 24, probe 2406*a* and probe 2406*h* are electrically connected to plate 1906 of the capacitor 2408. An extension portion 1910 can electrically connect probe 2406*a* to plate 1906. (The connection of probe 2406*h* to plate 1906 is not visible in FIG. 24.) In addition, probe 2406*b*, probe 2406*d*, and probe 2406*e*, and 2406*g* are electrically connected to plate 2106 of the capacitor 2408. Extension portions 2110 electrically connect probe 2406*b*, probe 2406*d*, and probe 2406*e*, and 2406*g* to plate 2106. Probe 2406*c* and probe 2406*f* are not electrically connected to the capacitor 2408. Although one capacitor 2408 and eight probes 2406*a-h* are shown in FIG. 24, more capacitors 2408 and more or fewer probes 2406*a-h* can be made. Moreover, any number of the probes 2406*a-h* can be connected to either of the plates 1906, 2106 of the capacitor 2408. The specific configuration shown in FIG. 24 is thus exemplary only and provided for purposes of illustration and discussion. Many other configurations are possible. In addition, the probes 2406*a-h* can be any of many different types of probes, including the many different types of probes discussed above with respect to probe 102. Moreover, a capacitor 2408 is a non-limiting example of an electronic component that can be fabricated. As mentioned above, according to some embodiments, the capacitor 2408 can alternatively or additionally be any electronic component including without limitation one or more resistors, inductors, diodes, driver circuits, transistors, integrated circuits, etc. Moreover, capacitor 2408 can comprise a plurality of capacitors.

Figure 14A:
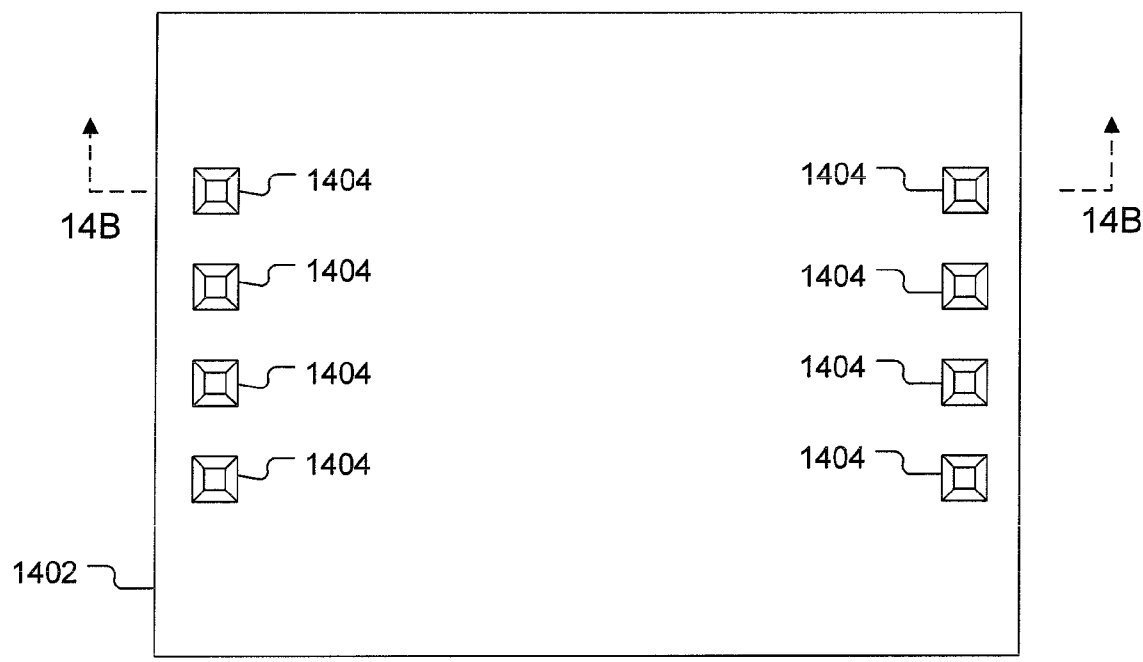
FIGS. 14A-23B illustrate an exemplary process in which probes are formed with a capacitor on a sacrificial substrate according to some embodiments of the invention.
Figure 14B:
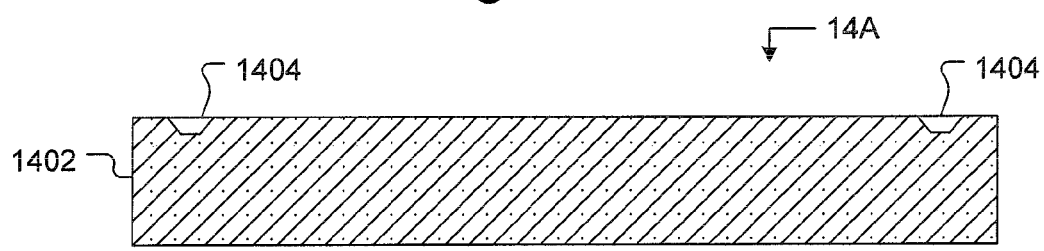

FIGS. 14A-23B illustrate an exemplary process for making the capacitor 2408 and probes 2406*a-h* of FIGS. 23A, 23B, and 24 according to some embodiments. FIGS. 14A and 14B illustrate a top view and a cross-sectional side view, respectively, of the sacrificial substrate 1402, which can be any suitable substrate including, without limitation, a semiconductor substrate e.g., a silicon wafer), an organic substrate, an inorganic substrate, a ceramic substrate, etc. As shown in FIGS. 14A and 14B, according to some embodiments, pits 1404 can be etched into sacrificial substrate 1402. As will be seen, the tips 1606 of probes 2406*a-h* can be formed in part in pits 1404. Consequently, pits 1404 can be formed in a pattern that corresponds to the desired pattern of tips 1606. For example, if probes 2406*a-h* are to be used as probes (like probes 226) on a probe card assembly (like probe card assembly 200) to contact terminals (like terminals 220) of ore or more DUTs (like DUT 228), pits 1404 can be laid out in a pattern that corresponds to the pattern of terminals on the DUT or DUTs. Moreover, pits 1404 can be shaped to correspond to the desired shape of the tips 1606 of the probes 2406*a-h*. Non-limiting examples of tip shapes include pyramids, truncated pyramids, blades, bumps, etc.

The pits 1404 can be formed using any suitable means including without limitation chemical etching, stamping, carving, laser ablation, abrading, etc. Non-limiting examples of suitable chemical etchants include oxides, including without limitation potassium oxide (KOH). Reactive ion etching techniques may also be used.

Pits 1404 can be formed using lithographic techniques like those used to form integrated circuits in semiconductor materials. For example, sacrificial substrate 1402 can be a silicon wafer, and a non-limiting exemplary process for forming pits 1404 can be as follows: form an oxide layer on the wafer; apply a layer of masking material (e.g., a photoresist) over the oxide layer, and form openings in the masking material, exposing portions of the oxide layer that correspond to desired locations of pits 1404; remove the exposed portions of the oxide layer (e.g., by etching with an etchant such as a buffered oxide etchant), exposing selected portions of the wafer; remove the masking material; and etch pits 1404 in the exposed portions of the wafer. Potassium hydroxide or other crystallographic etchants can be used to form tapered pits, like pits 1404. Using the foregoing or other lithographic techniques, the positions of pits 1404, and thus the resulting tips 1606 of probes 2406*a-h*, can be positioned precisely, and the tips 1606 can be formed in tight pitches. For example, pitches in which pits 1404 (and thus tips 1606 of probes 2406*a-h*) are spaced 70 microns or less from one another are possible using such lithographic techniques. Pit 1404 can, of course, be formed in pitches greater than 70 microns.

Figure 15A:
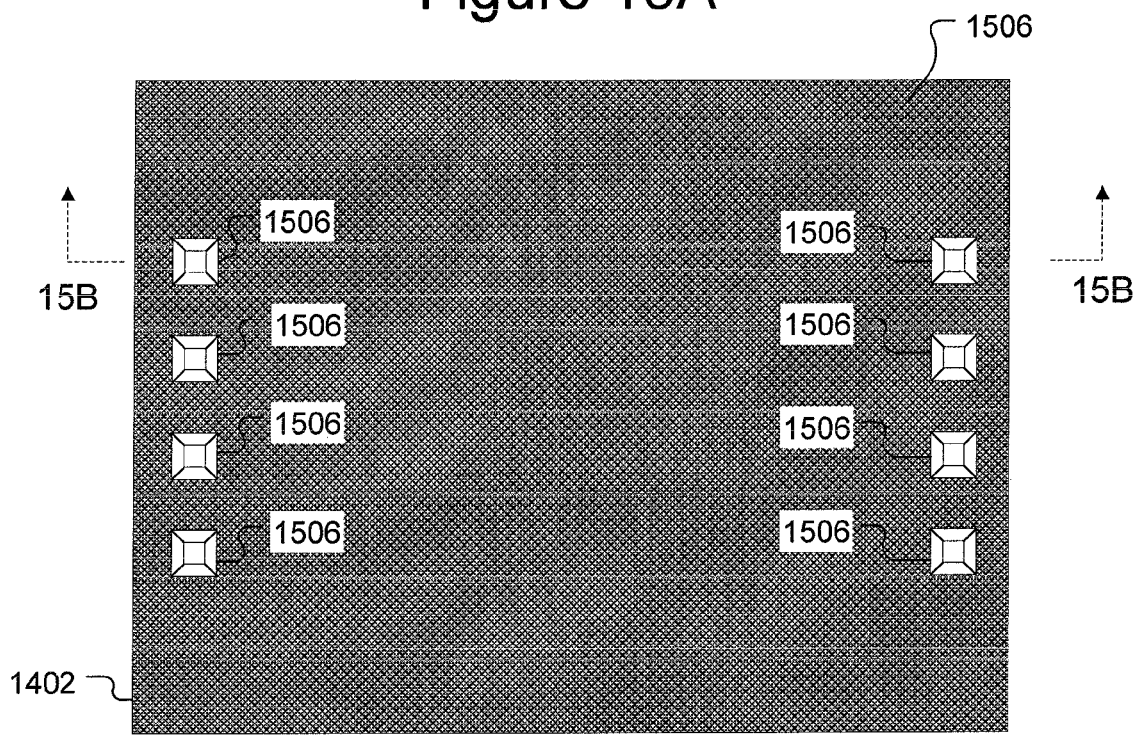
Figure 15B:
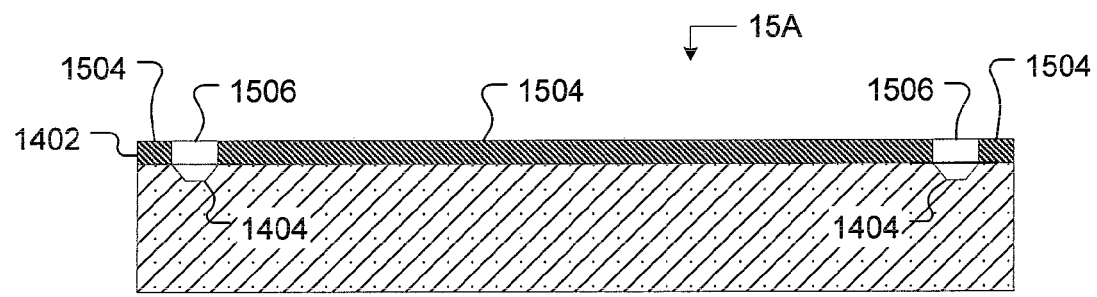

As shown in FIGS. 15A and 15B, a patternable first masking material 1504 can be deposited over sacrificial substrate 1402 and patterned to have openings 1506 exposing pits 1404. The first masking material 1504 can be any material that can be deposited over sacrificial substrate 1402 and patterned to have openings 1506. For example, masking material 1504 can be a photoresist material, which as known, can be deposited (e.g., coated) in a blanket layer over substrate 1402, after which selected portions (e.g., portions corresponding to openings 1506) can be removed. Alternatively, masking material 1504 can be deposited around a sacrificial material (not shown) deposited into pits 1404 and shaped in the desired shape of the tips 1606, after which the sacrificial material (not shown) can be removed. For example, the sacrificial material (not shown) can be a photoresist material deposited into pits 1404 and onto the substrate 1402 and then selectively removed to leave material corresponding to openings 1506 shown in FIGS. 15A and 15B. The masking material 1504 can be a metal (e.g., copper) electroplated onto a conductive seed layer (not shown) on the substrate 1402 and around the photoresist material (not shown). The photoresist material (not shown) can then be removed, leaving the metal as the masking material 1504 shown in FIGS. 15A and 15B. As mentioned above, tips 1606 of probes 2406*a-h* can be formed in pits 1404 and openings 1506. Consequently, openings 1506 can be shaped to correspond to desired shapes of tips 1606.

Figure 16A:
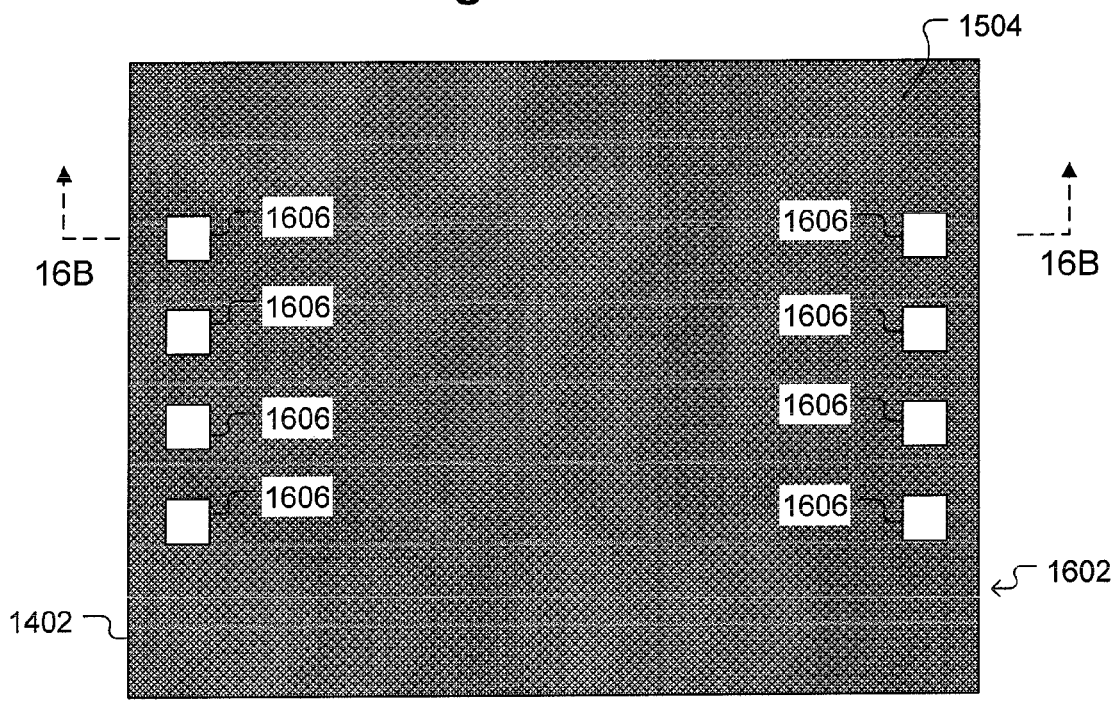
Figure 16B:
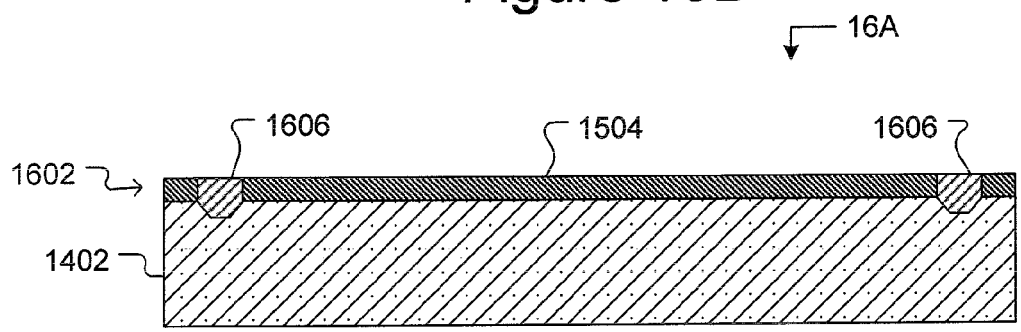

As shown in FIGS. 16A and 16B, openings 1506 and pits 1404 can be filled with one or materials to form tips 1606 of probes 2406*a-h*. The material or materials deposited into openings 1506 and pits 1404 to form tips 1606 can be an electrically conductive material or materials. Non-limiting examples of suitable materials for tips 1606 include palladium, gold, rhodium, nickel, cobalt, silver, platinum, conductive nitrides, conductive carbides, tungsten, titanium, molybdenum, rhenium, indium, osmium, rhodium, copper, refractory metals, and their alloys including combinations of the foregoing. Moreover, the material or materials deposited into openings 1506 and pits 1404 can be deposited using any suitable deposition method including, without limitation, electroplating, chemical vapor deposition, physical vapor deposition, sputter deposition, electroless plating, electron beam deposition, thermal evaporation, flame spring coating, plasma spray coating, etc. If the material or materials are electroplated into openings 1506 and pits 1404, a thin layer of conductive material (not shown) forming a seed layer can first be deposited onto the bottoms of pits 1406. As is known, such a seed layer (not shown) can be electrically connected to the cathode or anode of electroplating equipment (not shown) to facilitate the electroplating process. As another alternative, the seed layer (not shown) can be deposited as a blanket layer over substrate 1402, and first masking material 1504 can be deposited over the seed layer (not shown). After the material or materials forming tips 1606 are deposited in openings 1506 and pits 1404, the outer surface of masking material 1504, along with ends of the tips 1606, can be planarized. Alternatively, the masking material 1504 can be removed and a conformal material (not shown) can be deposited onto the substrate 1402 and around and over the tips 1606. An outer surface of the conformal material (not shown) and ends of the tips 1606 can be planarized. Planarizing the outer surface of masking material 1504 (or a conformal material (not shown)) can remove any excess material deposited into openings 1506 and can planarize the ends of tips 1606. Planarizing can be accomplished, for example, by any mechanical or chemical-mechanical grinding or lapping process.

Figure 17A:
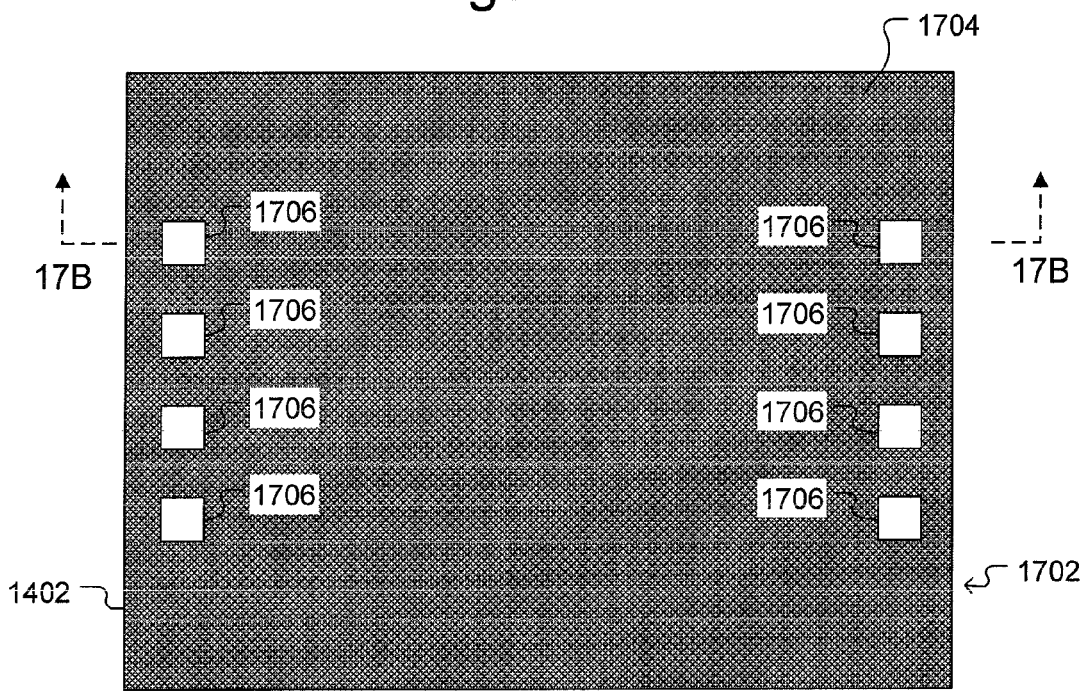
Figure 17B:
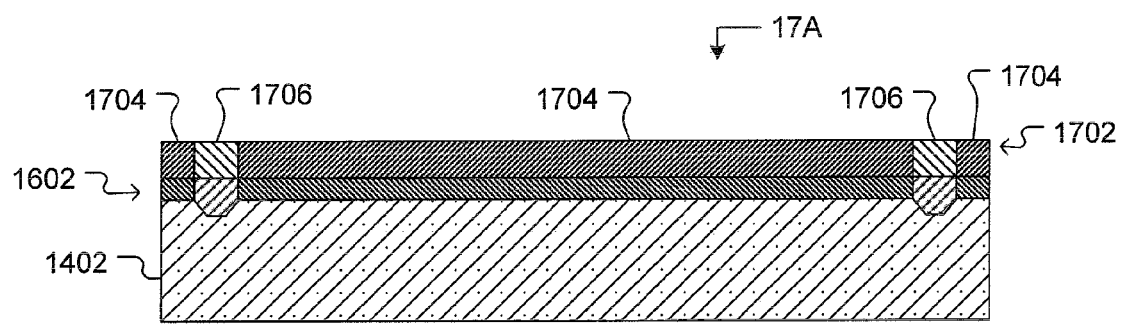

As also shown in FIGS. 16A and 16B, the first masking material 1504 and tips 1606 can form a first layer 1602. As shown in FIGS. 17A and 17B, a second masking material 1704 can be deposited over the first layer 1602 and patterned to form openings (not shown), and the openings can be filled with one or more materials to form the bases 1706 of probes 2406a-h.

Figure 18A:
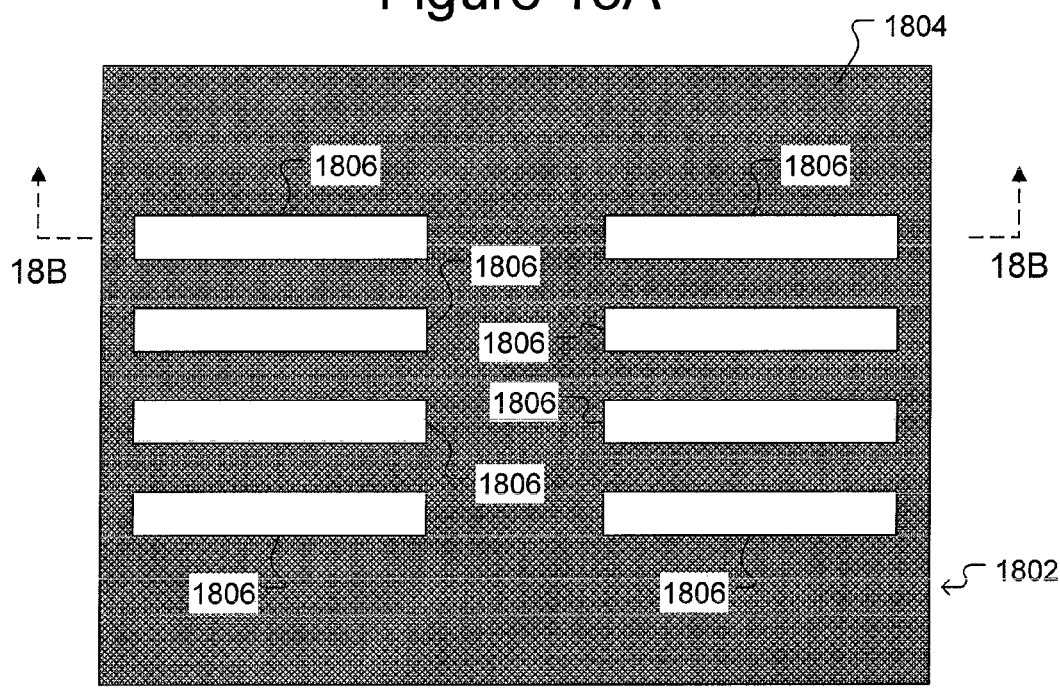
Figure 18B:
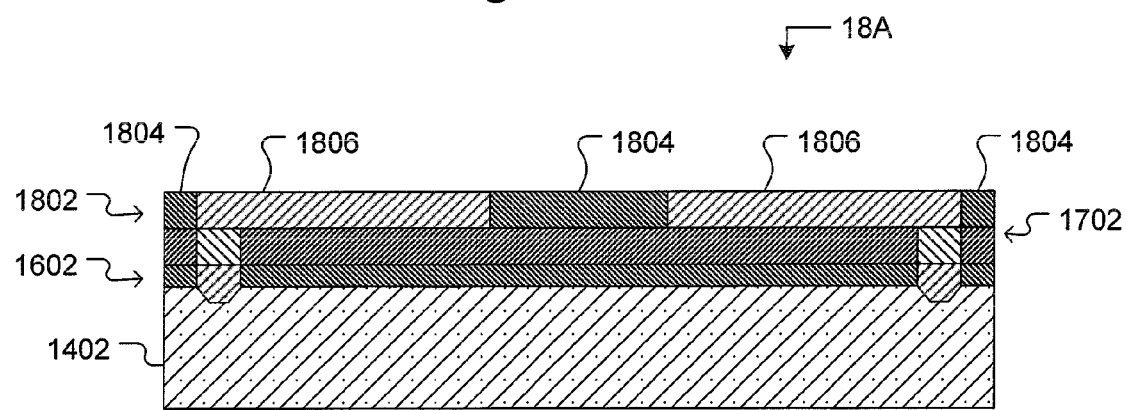

As shown in FIGS. 18A and 8B, a third masking layer 1804 can be deposited over the layer 1702 comprising the second masking layer 1704 and bases 1706. Openings (not shown) can be patterned in the third masking layer 1804 to correspond to the beams 1806 of probes 2406a-h, and one or more materials can be deposited into the openings (not shown) to form beams 1806 of probes 2406a-h.

Figure 19A:
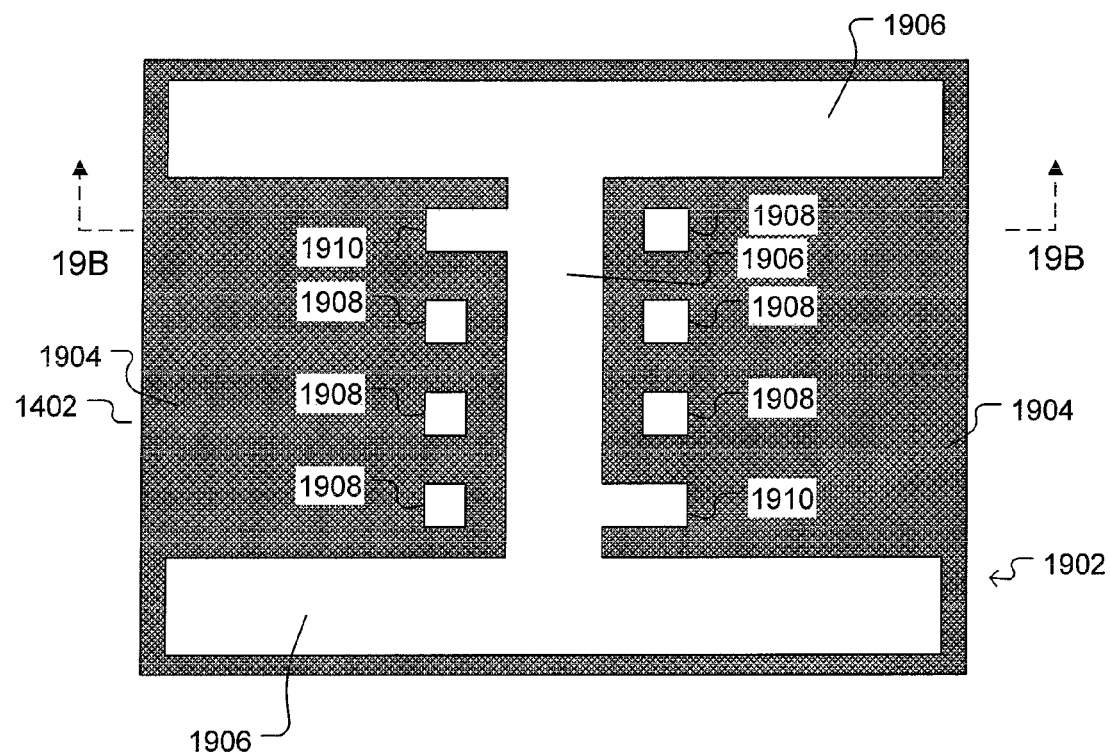
Figure 19B:
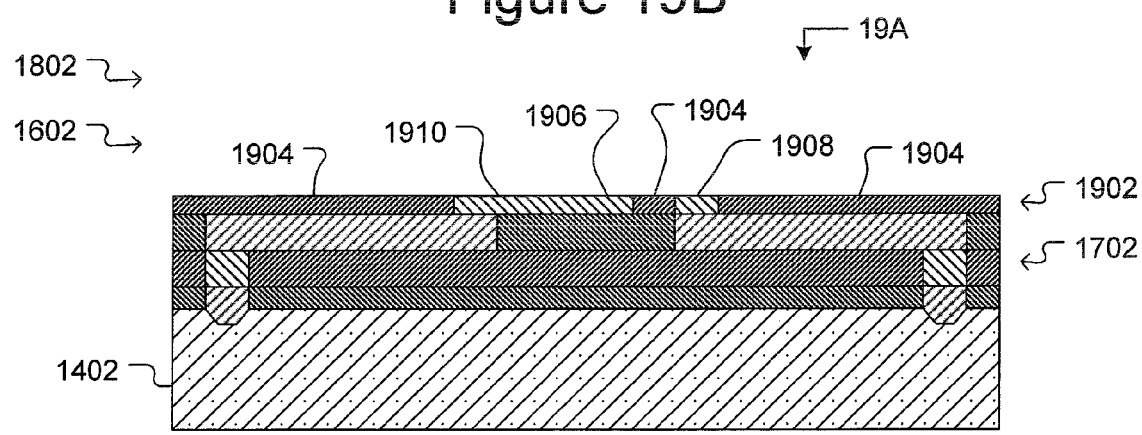

As shown in FIGS. 19A and 19B, a fourth masking material 1904 can be deposited over the layer 1802 (comprising the third masking layer 1804 and beams 1806) and patterned to have openings (not shown), which can be filled with one or more materials to form a first plate 1906 of the capacitor 2408, spacers 1908, and connection extensions 1910. As best seen in FIG. 19A, the first plate 1906 of the capacitor 2408 can occupy unused area (e.g., area not occupied by probes 2406a-h) over substrate 1402. Spacers 1908 and connection extensions 1910 form part of the post structure 2410 of each probe 2406a-h, and each connection extensions 1910 can also electrically connect one of the probes 2406a-h to the first plate 1906 of capacitor 2408.

The second masking material 1704, third masking material 1804, and fourth masking material 1904 can be generally the same as or similar to first masking material 1504 and can be deposited and patterned in the same or a similar manner as first masking material 1504. Alternatively, the second masking material 1704, third masking material 1804, and fourth masking material 1904 can be different than the first masking material 1504 and can be deposited and patterned differently than first masking material 1504. The material or materials that form the bases 1706, the beams 1806, the first plate 1906, spacers 1908, and connection extensions 1910 can be the same as or similar to the material or materials that form tips 1606 and can be deposited and processed (e.g., planarized) in the same or a similar manner. Alternatively, the material or materials that form the bases 1706, the beams 1806, the first plate 1906, spacers 1908, and connection extensions 1910 can be different than material or materials that form tips 1606 and can be deposited and processed (e.g., planarized) in different ways.

Figure 20A:
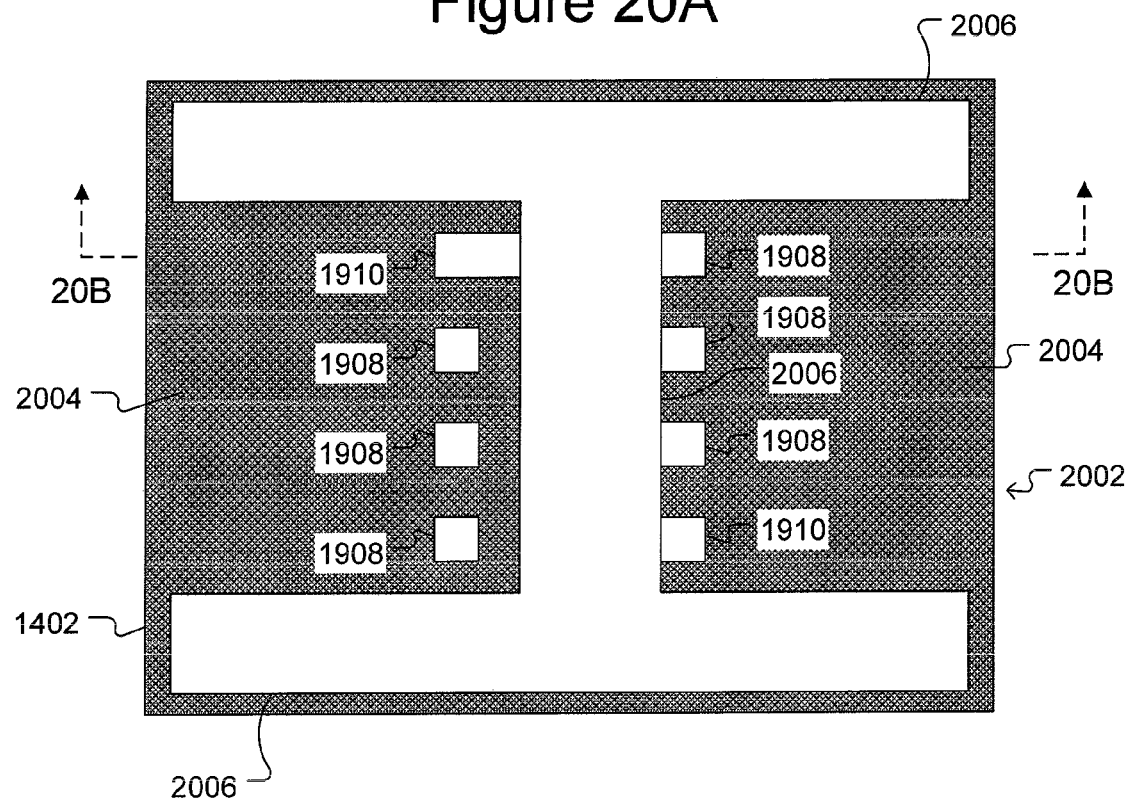
Figure 20B:
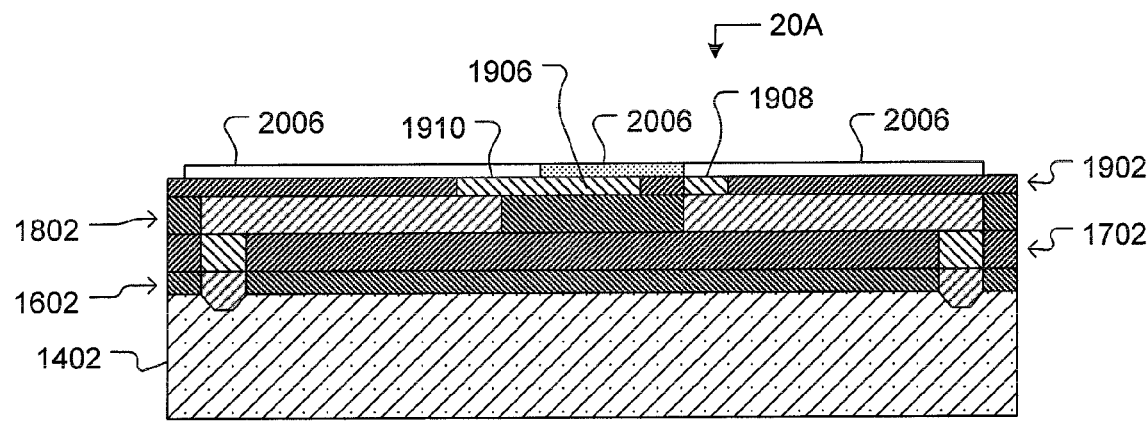

As shown in FIGS. 20A and 20B, a dielectric material 2006 can be deposited generally over and extend beyond the first plate 1906, which as discussed above, can be the dielectric material 2006 between the plates 1906, 2106 of capacitor 2408. The dielectric material 2006 can be any dielectric material and can be selected based on desired properties of the capacitor 2408. Dielectric material 2006 can be deposited and patterned in any suitable manner. For example, the dielectric material 2006 can be deposited as a blanket layer over all or much of a fourth layer 1902 (which comprises the fourth masking material 1904, the first plate 1906, and the spacers 1908), and selected portions of the blanket layer can be removed to leave the pattern of dielectric material 2006 shown in FIGS. 20A and 20B. For example, a layer of masking material (not shown) can be deposited over the blanket layer of dielectric material and patterned to cover only the portions of the blanket layer that are to remain. The exposed portions of the blanket layer can then be etched away. As another example, a layer of masking material (not shown) can first be deposited and patterned with an opening that corresponds to the first plate 1906, and the dielectric material can thereafter be deposited into the opening (not shown). Whether deposited as a blanket layer and then patterned or deposited into an opening in a masking material, the dielectric material can be deposited in any suitable manner, including without limitation chemical vapor deposition, physical vapor deposition, sputter deposition, electron beam deposition, thermal evaporation, etc.

Figure 21A:
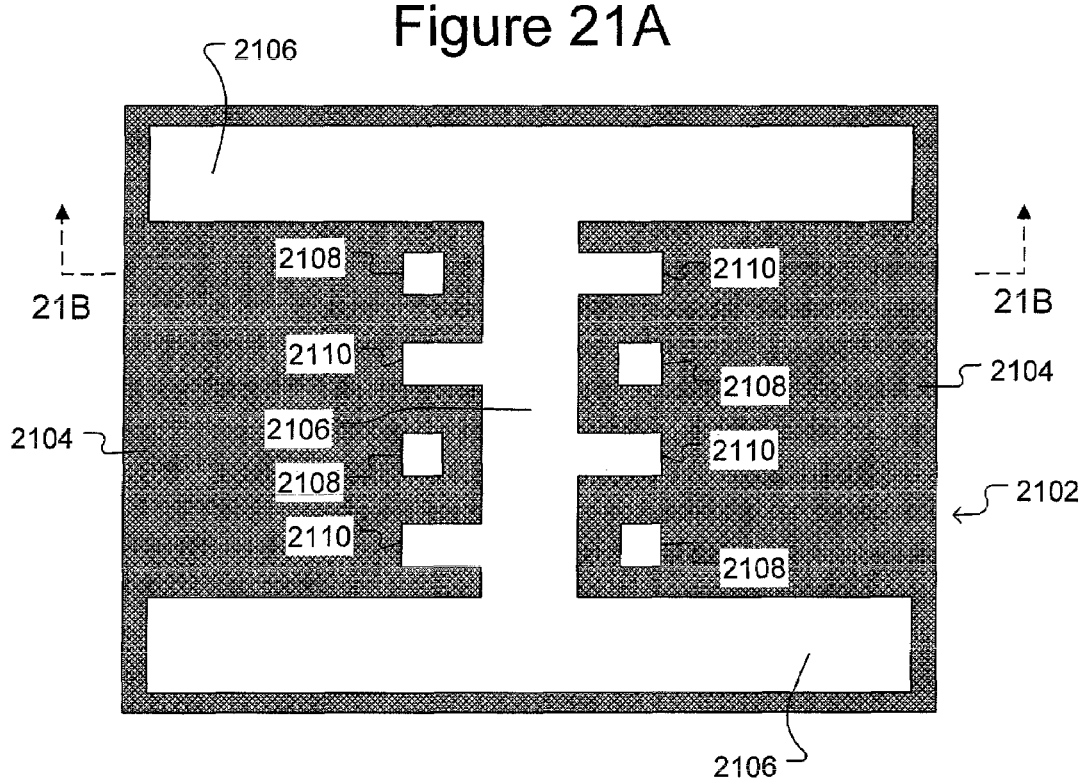
Figure 21B:
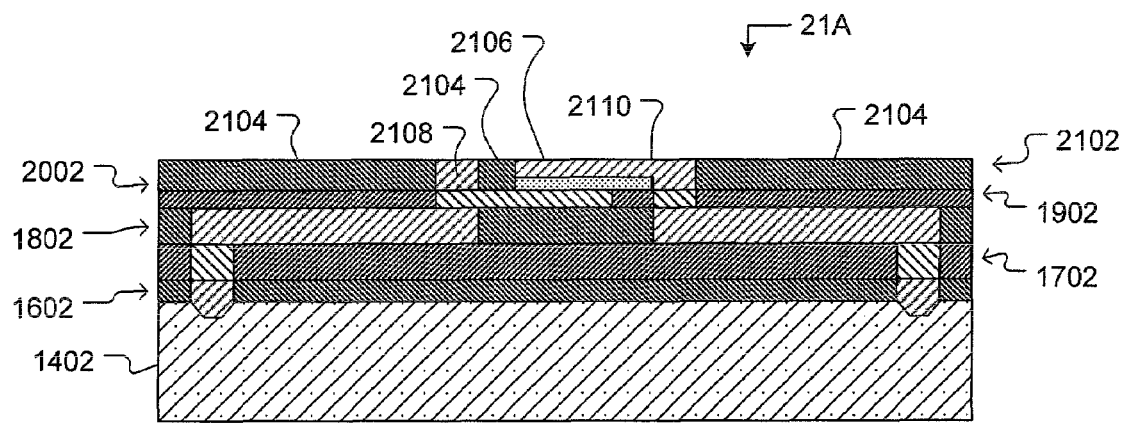

As shown in FIGS. 21A and 21B, a fifth masking material 2104 can be deposited over the fourth layer 1902 and the dielectric material 2006 and patterned to have openings (not shown), which can be filled with one or more materials to form a second plate 2106 of the capacitor 2408, spacers 2108, and connection extensions 2110. As best seen in FIG. 21A, the second plate 2106 of the capacitor 2408 can be located and shaped to correspond to the first plate 1906 and the dielectric material 2006. Spacers 2108 and connection extensions 2110 form part of the post structure 2410 of each probe 2406a-h, and each connection extension 2110 also electrically connects a probe 2406a-h to the second plate 2106 of capacitor 2408.

Figure 22A:
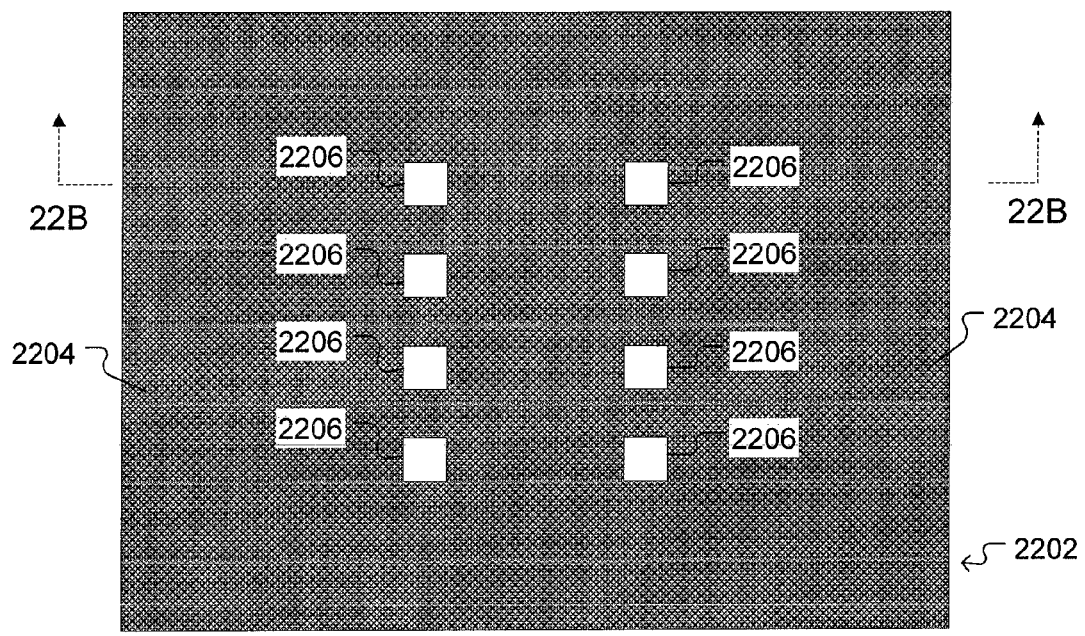
Figure 22B:
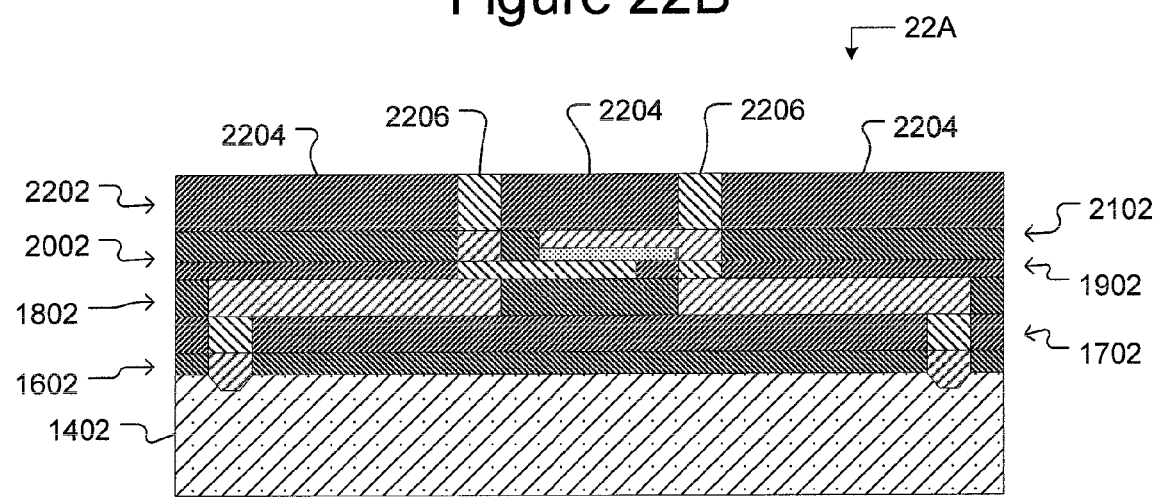

As shown in FIGS. 22A and 22B, a sixth masking layer 2204 can be deposited over the layer 2102 comprising the fifth masking layer 2104, second plate 2106, spacers 2108, and connection extensions 2110. Openings (not shown) can be patterned in the sixth masking layer 2204, and one or more materials can be deposited into the openings (not shown) to form posts 2206 of probes 2406a-h. Posts 2206, along with spacers 1908, extension connections 1910, spacers 2108, and connection extensions 2110, can form the post structures 2410 of probes 2406a-h.

The fifth masking material 2104 and sixth masking material 2204, 2304 can be generally the same as or similar to (or can be different than) the first masking material 1504 and can be deposited and patterned in the same or a similar manner as (or in a different manner than) the first masking material 1504. The material or materials that form the spacers 2108, second plate 2106, connection extensions 2110, and posts 2206 can be the same as or similar to (or different than) the material or materials that form tips 1606 and can be deposited and processed (e.g., planarized) in the same or a similar manner (or in a different manner).

Figure 25:
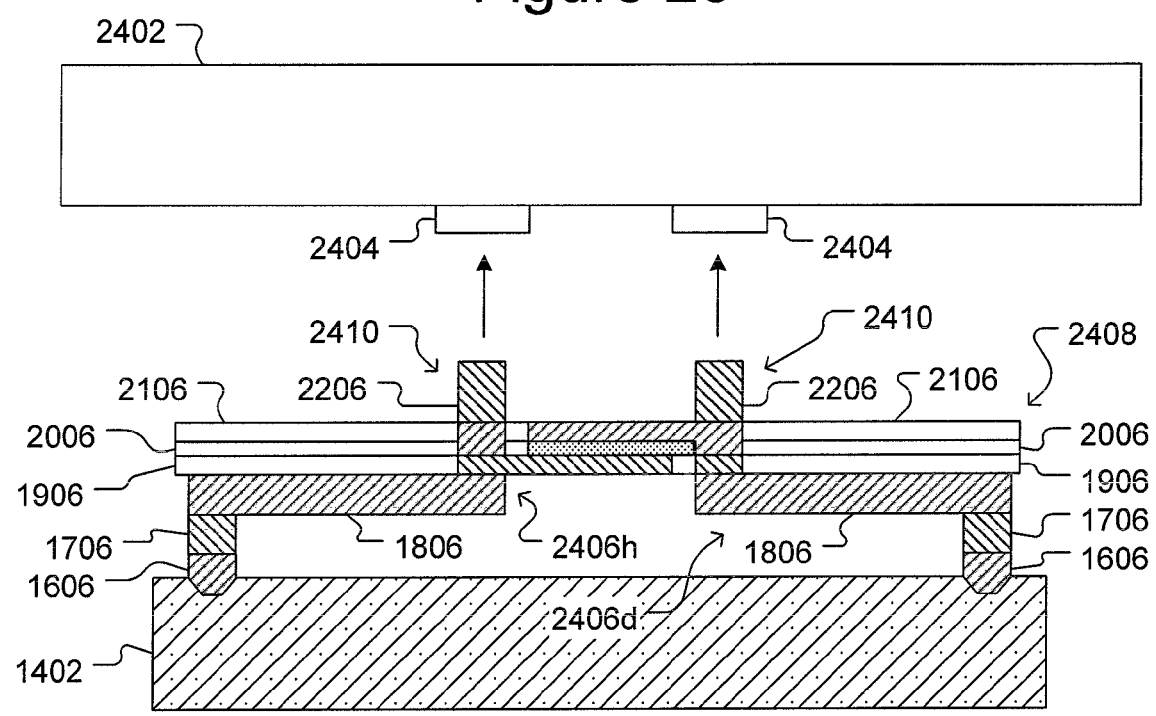
FIG. 25 illustrates attachment of the probes formed by the process of FIGS. 14A-23B to a substrate.

As shown in FIGS. 23A, 23B, and 24, the masking materials 1504, 1704, 1804, 1904, 2104, 2204 can be removed, leaving a plurality of probes 2406a-h (eight are shown but more or fewer can be implemented) attached at their tips 1606 to a sacrificial substrate 1402 and a capacitor 2408 to which ones of the probes 2406a-h are electrically connected. As shown in FIG. 25, the probes 2406a-h can be attached by their posts 2206 to terminals 2404 of another suitable means. For example, posts 2206 can be attached to terminals 2404 by solder (not shown), brazing (not shown), adhesives (not shown), etc. The probes 2406a-h can then be released from the sacrificial substrate 1402 and the sacrificial substrate 1402 removed, leaving the probes 2406a-h attached by their posts 2206 to substrate 2402.

Tips 1606 can be released from sacrificial substrate 1402 in any suitable manner. For example, substrate 1402 can be removed by etching substrate 1402 away using an etchant that etches substrate 1402 but does not substantially etch tips 1606. As another example, a layer of release material (not shown) can be deposited in pits 1404 prior to depositing the material or materials that form tips 1606. Tips 1606 can be released from the sacrificial substrate 1402 by etching the release layer (not shown) away using an etchant that etches the release layer but does not substantially etch the tips 1606. If a seed layer (not shown) is deposited in pits 1404 as discussed above, the seed layer can also function as a release layer.

The tips 1606 of the probes 2406a-h can then be pressed against terminals of an electronic device (not shown) and thereby form electrical connections between the terminals of the electronic device (not shown) and substrate 2402 through probes 2406a-h. As one non-limiting example, substrate 2402 can be a probe substrate, like probe substrate 224 of FIG. 2, and substrate 2402 can thus be used in a probe card assembly, like probe card assembly 200 of FIG. 2. In such a configuration, probes 2406a-h can be like probes 226 of FIG. 2 and can be disposed to contact terminals, like terminals 220, of one or more DUTs, like DUT 228 of FIG. 2. Capacitor 2408 can function as a decoupling capacitor, like capacitor 308 of FIG. 3.

FIGS. 26A-30B illustrate another exemplary process for fabricating a an electronic component (e.g., a capacitor 3008 (see FIG. 30B)) and a plurality of probes 3006 (see FIG. 30B) ones of which can be electrically connected to the electronic component according to some embodiments of the invention. As will be seen, the process illustrated in FIGS. 26A-30B can be generally similar to the process shown in FIGS. 14A-24 except that the capacitor 3008, which is formed by plates 2606, 2806 and dielectric material 2706, is elevated above the probes 3006 by spacers 2506. As can be seen in FIGS. 27A-29B, the plates 2606, 2806 and dielectric material 2706 that form capacitor 3008, and thus capacitor 3008, can be made to cover a larger area of substrate 1402 than the capacitor 2408 made by the process shown in FIGS. 14A-24. (For example, compare the first plate 1906 in FIG. 19A to the first plate 2606 in FIG. 27A.) As with the process of FIGS. 14A-24, the process shown in FIG. 26A-30B can be used to make electronic components other than capacitors. For example, the capacitor 3008 can alternatively or additionally be one or more resistors, inductors, diodes, transistors, driver circuits, integrated circuits, etc. As another example, capacitor 3008 can comprise a plurality of capacitors. For example, capacitor 3008 can comprise a plurality of capacitors connected in series, in parallel, or in a network comprising series and parallel connections. Moreover, such a plurality of capacitors can be deposited in the same or in different planes.

Figure 26A:
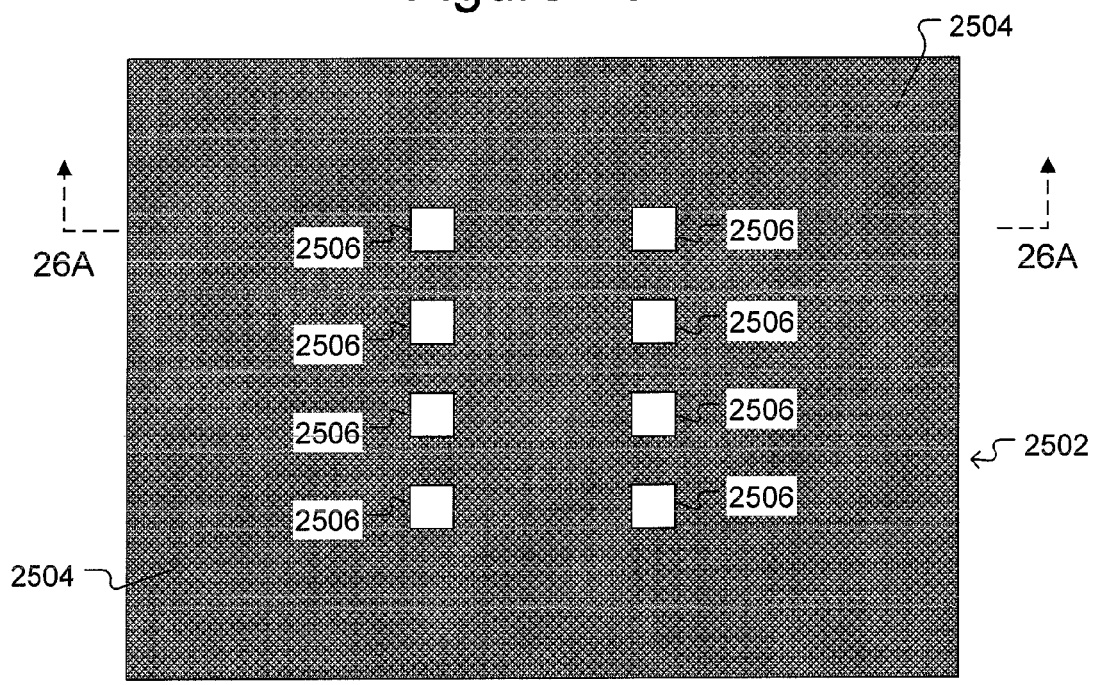
FIGS. 26A-30B illustrate another exemplary process in which probes are formed with a capacitor on a sacrificial substrate according to some embodiments of the invention.
Figure 26B:
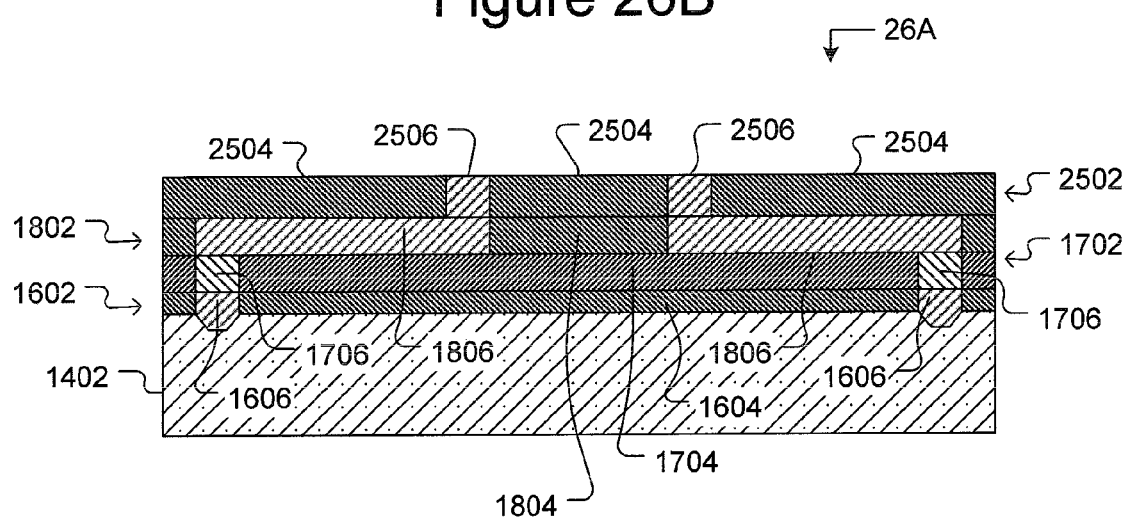
Figure 27A:
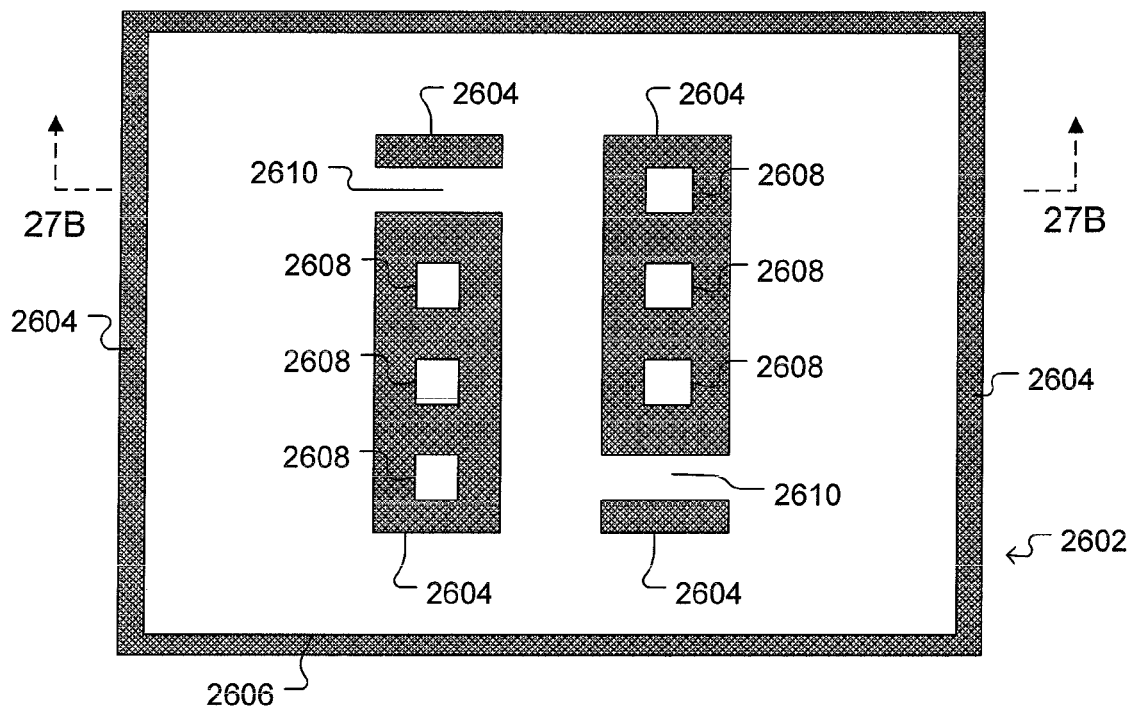
Figure 27B:
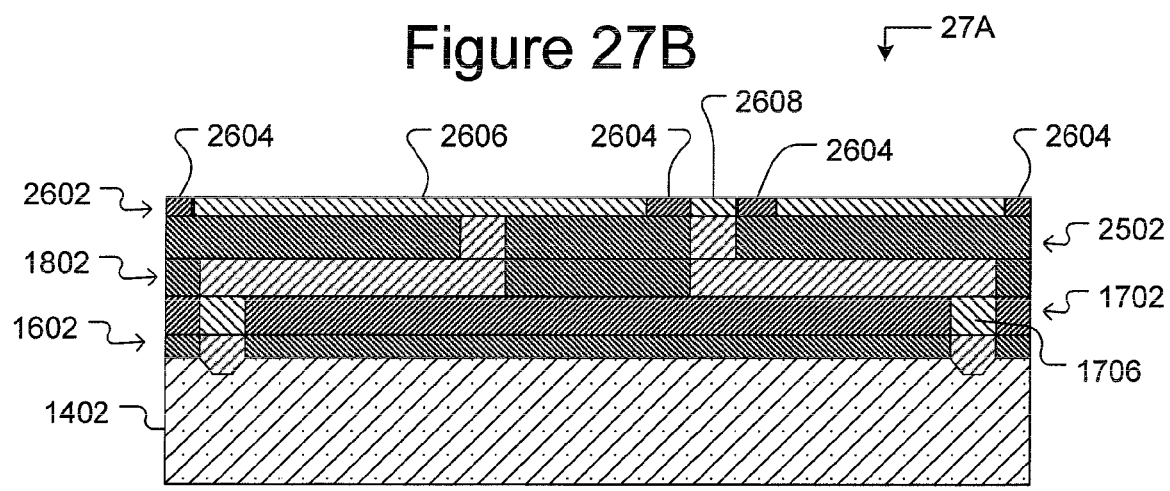
Figure 28A:
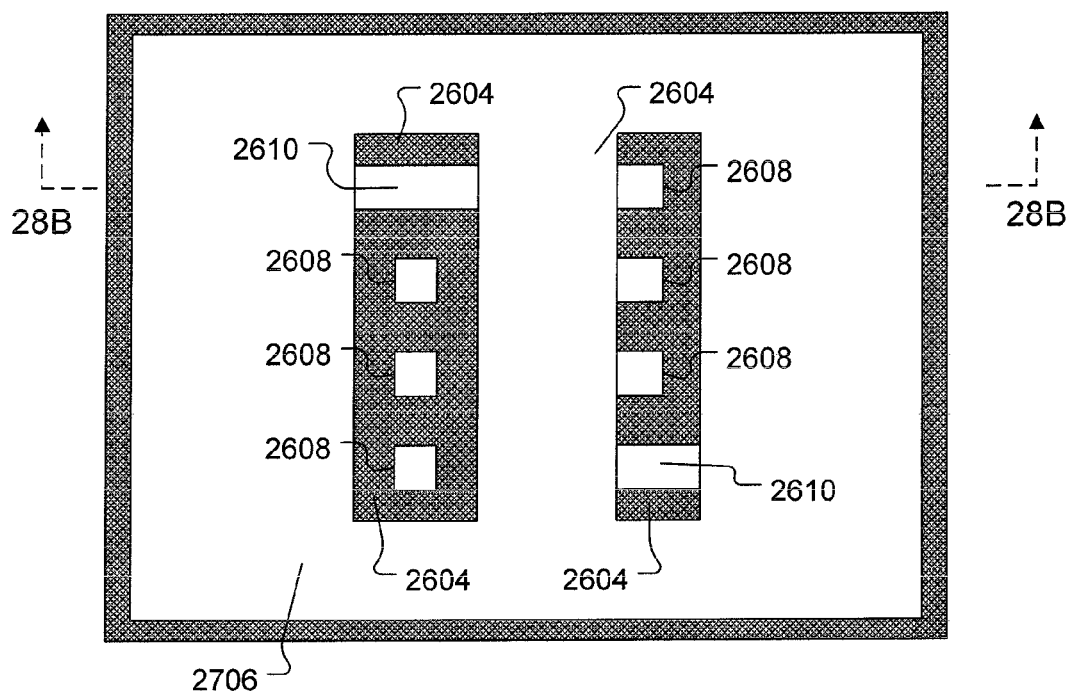
Figure 28B:
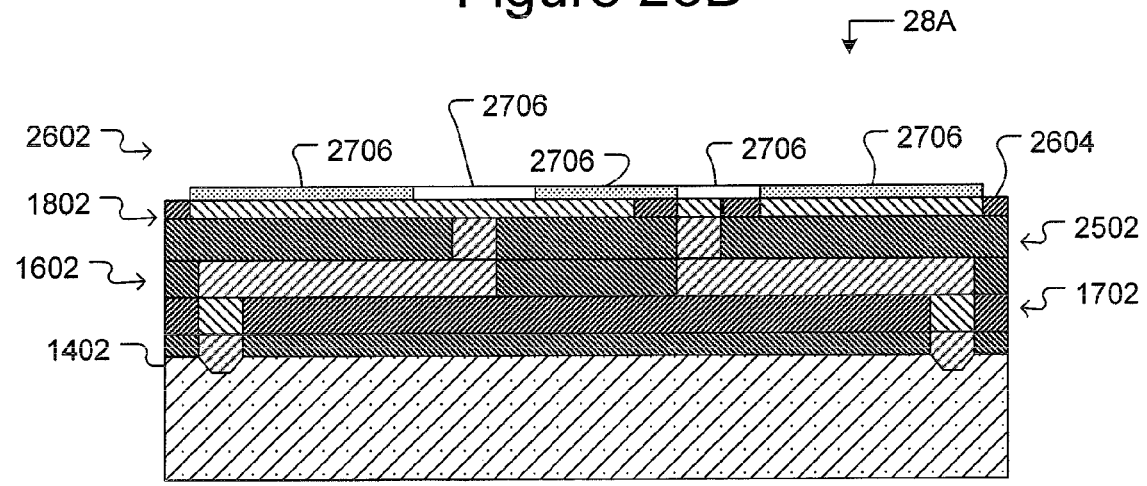
Figure 29A:
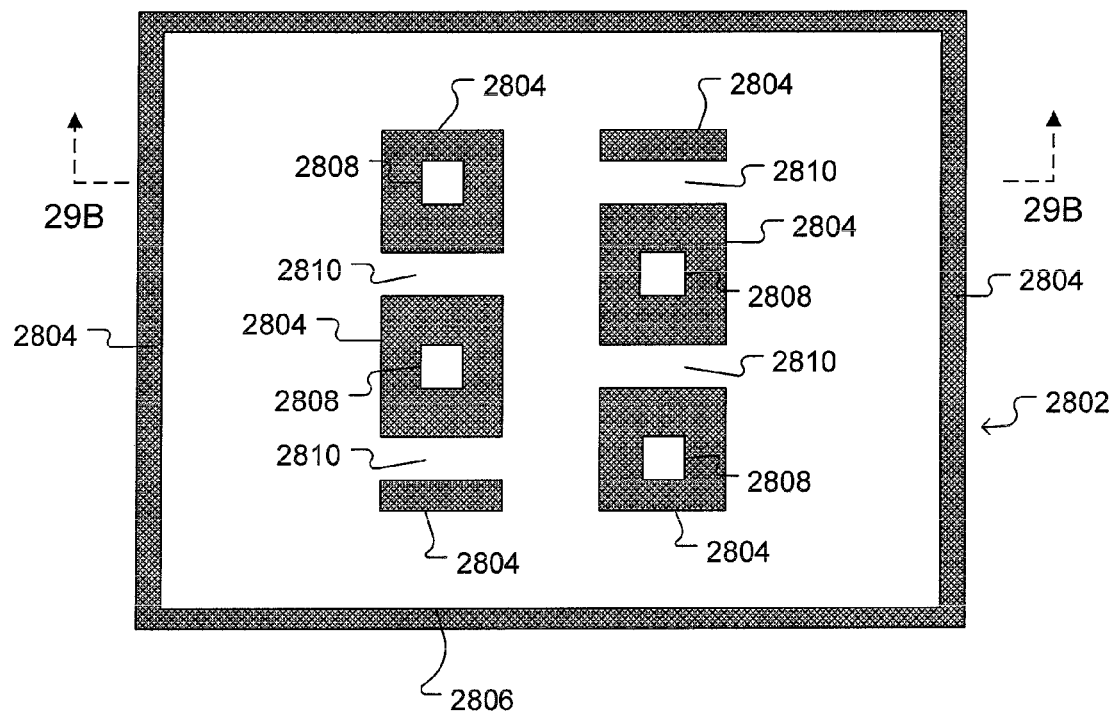
Figure 29B:
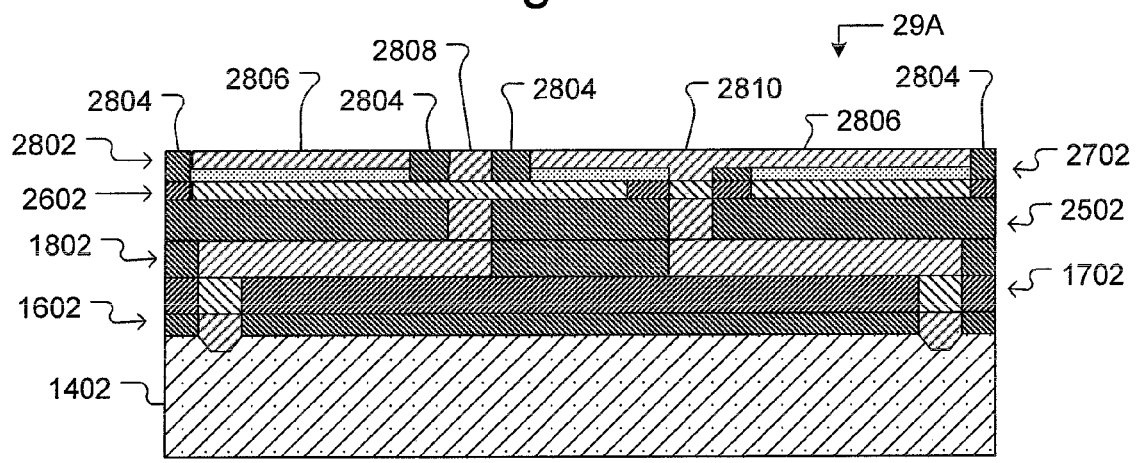

Turning now to a more detailed discussion of the process show in FIGS. 26A-30B, FIGS. 26A and 26B show the sacrificial substrate 1402, first layer 1602 comprising tips 1606 formed in openings (not shown) in first masking material 1504, second layer 1702 comprising bases 1706 formed in openings (not shown) in second masking material 1704, and third layer 1802 comprising beams 1806 formed in openings (not shown) in third masking material 1804 as described above with respect to FIGS. 14A-18B. The process shown in FIGS. 26A-30B can thus begin the same as the process shown in FIGS. 14A-24. More specifically, the process of FIGS. 26A-30B can begin with what is shown in FIGS. 14A-18B. After FIGS. 18A and 18B, however, as shown in FIGS. 26A-26B, the process of FIGS. 26A-30B can diverge. Specifically, as shown in FIGS. 26A and 26B, a fourth masking layer 2504 can be deposited over the layer 1802 comprising the third masking material 1804 and beams 1806. Openings (not shown) can be patterned in the fourth masking layer 2504, and one or more materials can be deposited into the openings (not shown) to form spacers 2508. As will be seen, the spacers 2508 can form part of the post structure 3010 of each probe 3006. (See, e.g., FIG. 30B.) In addition, the spacers 2508 can be sized to elevate the capacitor 3008 sufficiently above the beams 1806 to prevent the beam 1806 from colliding with the first plate 2608 during compression of the probe 3006.

Figure 30A:
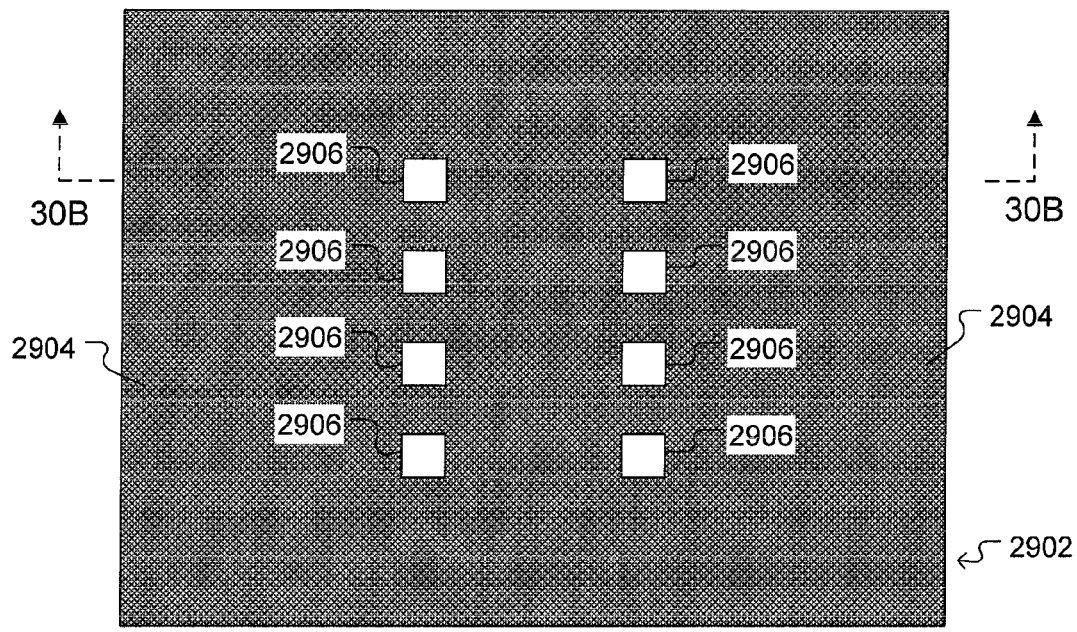
Figure 30B:
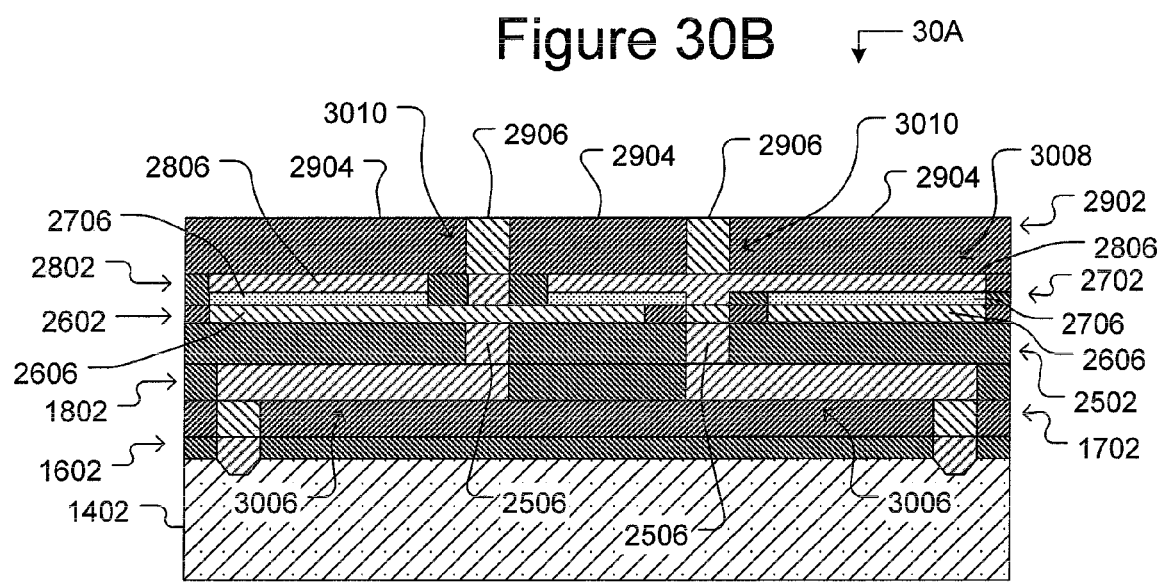

Thereafter, a first electrically conductive plater 2606, conductive spacers 2608 and connection extensions 2610 can be formed in openings (not shown) in a fifth masking material 2604 (see FIGS. 27A and 27B); a dielectric material 2706 can be formed on the first plate 2606 (see FIGS. 28A and 28B); a second electrically conductive plate 2806, conductive spacers 2808, and connection extensions 2810 can be formed in a sixth masking material 2804 (see FIGS. 29A and 29B); and electrically conductive posts 2906 can be formed in openings (not shown) in an seventh masking material 2904 (see FIGS. 30A and 30B).

Fourth masking layer 2504, fifth masking layer 2604, sixth masking layer 2804, and seventh masking layer 2904 can be the same as or similar to any of the masking layers 1504, 1704, 1804, 1904, 2104, 2204 discussed above and can be deposited and processed (e.g., formed) in the same or similar manner. Likewise, the materials that form tips 1606, bases 1706, beams 1806, spacers 2506, first plate 2606, spacers 2608, connection extensions 2610, spacers 2708, second plate 2806, spacers 2808, connection extensions 2810, and posts 2906 can be the same or similar to the materials that form like named elements in FIGS. 14A-24 and can be deposited and processed (e.g., planarized) in the same or similar manner. Similarly, dielectric material 2706 can be the same as or similar to dielectric material 2006 and can be deposited and patterned in the same or similar manner.

As should be apparent, the first plate 2606, dielectric material 2706, and the second plate 2806 form a capacitor 3008, which in some respects can be like capacitor 2408 of FIG. 24. Connection extensions 2610 electrically connect ones of spacers 2606, and thus ones of probes 3006, to the first plate 2606 of capacitor 3008, and connection extensions 2810 electrically connect ones of probes 3006 to the second plate 2806 of capacitor 3008. As should also be apparent spacers 2506, connection extensions 2610 and spacers 2608, spacers 2708, connection extensions 2810 and spacers 2808, and posts 2906 form the post structures 3010 of probes 3006.

Although not shown, the masking layers 1504, 1704, 1804, 2504, 2604, 2804, 2904 can be removed, leaving a plurality of probes 3006 attached by their tips 1606 to sacrificial substrate 1402 and a capacitor 3008 to which ones of the probes 3006 are electrically connected. Indeed, the resulting probes 3006 and capacitor 3008 can be generally similar to the probes 2406a-h and capacitor 2408 shown in FIG. 24 except that the capacitor 3008 is elevated above probes 3006 by spacers 2508, which can allow capacitor 3008 to occupy a larger area than capacitor 2408.

Although not shown, probes 3006 can be attached by their posts 2906 to terminals, like terminals 2404, of a substrate, like substrate 2402, as generally shown in FIG. 25. The tips 1606 can be released from the sacrificial substrate 1402, and the sacrificial substrate 1402 can be removed, leaving the probes 3006 attached by their posts 2906 to terminals 2404 of substrate 2402. The posts 2906 can be attached to the terminals 2404 in the same way that posts 2410 are attached to terminals 2404. For example, posts 2906 can be attached to terminals 2404 by solder (not shown), brazing (not shown), conductive adhesives (not shown), etc. As discussed above, substrate 2402 can be a probe substrate and can be used as the probe substrate 224 in the probe card assembly of FIG. 2. Probes 3006 can thus be used, like probes 226 of FIG. 2, to contact terminals, like 220, of one or more DUTs, like DUT 228, and capacitor 3008 can function like capacitor 308 of FIG. 3.

Although the invention is not so limited, in some embodiments, an electronic component, such as a capacitor, resistor, a transistor, a diode, and an integrated circuit (e.g., a driver circuit), can be electrically connected directly to a contact structure on a substrate (like the probes 226 on probe substrate 224 shown in FIG. 2) rather than being disposed on the substrate and connected to the contact structure through electrical connections that run on and/or through the substrate. As is known, in some applications, the closer an electronic component, can be placed to the contact tip of a probe, the better the performance of the electronic component. For example, the closer decoupling capacitor 308 of FIG. 3 is placed to the contact tip of the probe 226, the less the parasitic effects (e.g., capacitive and/or inductive effects) of the electrical path between the electronic component and the contact structure. As another example, the closer the driver circuit 1313 of FIGS. 13D and 13E is placed to the probes 1324, the less the more the driven loads appear to be solely the probes 1324.

Although specific embodiments and applications of the invention have been described in this specification, there is no intention that the invention be limited to these exemplary embodiments and applications or to the manner in which the exemplary embodiments and applications operate or are described herein. For example, although columns 802, 804, 806, 808, 1304, 1308, 1312, 1316 are shown in the Figures as comprising pairs of columns, one column—rather than two columns—can be used, and three or more columns can alternatively be used. As another example, and as mentioned earlier, although the fabrication of a capacitor as the electronic device has been described in some embodiments, it would be clear to one of ordinary skill in the art to apply the teachings of the embodiments herein and create other electronic components of the same or different type, configuration, and/or structure. As another example, any of the electronic components described herein can be fabricated in place or, alternatively, can be provided as a discrete, previously made electronic component and attached in place in many of the embodiments described herein.

What is claimed is:

1. A probe apparatus comprising:
   a substrate;
   a contact structure attached to the substrate, said contact structure comprising a resilient portion, an attachment portion comprising a post that is attached to and extends substantially perpendicularly from a first surface of the substrate, and a support portion disposed between the attachment portion and the resilient portion, wherein the support portion physically supports the resilient portion in a manner that separates the resilient portion from the attachment portion; and
   an electronic component directly attached and electrically connected to the support portion of the contact structure, wherein the electronic component is physically suspended from the support portion and spaced apart from the substrate such that the electronic component is not directly attached to the substrate or a terminal on the substrate,
   the apparatus further comprising a plurality of contact structures, each contact structure comprising an attachment portion attached to the substrate and a contact portion disposed away from the substrate and configured to contact an electronic device to be tested, and
   wherein the electronic component electrically connects at least two of the contact structures, and the contact portions of the at least two of the contact structures are independently moveable with respect to each other.

2. The apparatus of claim 1, wherein the electronic component comprises one of a resistor, a transistor, a diode, a driver circuit, and an integrated circuit.

3. The apparatus of claim 2, wherein the apparatus composes a probe card assembly.

4. The apparatus of claim 1, wherein the electronic component comprises a capacitor.

5. The apparatus of claim 4, wherein the capacitor comprises capacitively coupled conductors that are spaced apart by a distance, and the distance does not change while the resilient portion moves.

6. The apparatus of claim 1, wherein the resilient portion comprises a cantilevered beam.

7. The apparatus of claim 1, wherein the resilient portion comprises a spring structure.

8. The apparatus of claim 1, wherein each of the plurality of contact structures comprises a resilient portion to enable independent movement of each of the contact portions of the contact structures with respect to each other contact portion.

9. The apparatus of claim 1 further comprising a second contact structure attached to the substrate, the second contact structure comprising a second resilient portion, a second attachment portion attached to the substrate, and a second support portion disposed between the second attachment portion and the second resilient portion, wherein the electrical component is also directly attached to and electrically connected to the second support portion of the second contact structure.

10. The apparatus of claim 1, wherein the electronic component maintains substantially constant electrical characteristics while the resilient portion moves.

11. The apparatus of claim 1, wherein the electronic component is a discrete electronic component that is structurally distinct from the contact structure.

12. The apparatus of claim 1, wherein the resilient portion and the support portion both run substantially parallel with the first surface of the substrate.

13. The apparatus of claim 1, wherein the attachment portion is attached directly to the substrate and the support portion is directly attached to, and disposed between, both the attachment portion and the resilient portion.

14. A probe apparatus comprising:
   a substrate;
   a contact structure attached to the substrate, said contact structure comprising a resilient portion, an attachment portion attached to the substrate, and a support portion disposed between the attachment portion and the resilient portion;

an electronic component directly attached and electrically connected to the support portion of the contact structure, wherein the electronic component is suspended from the support portion and spaced apart from the substrate such that the electronic component is not directly attached to the substrate or a terminal on the substrate; and a plurality of contact structures, each contact structure comprising the attachment portion attached to the substrate and the contact portion disposed away from the substrate and configured to contact an electronic device to be tested, wherein the electronic component electrically connects at least two of the contact structures.

15. A probe apparatus comprising:

a substrate;

a contact structure attached to the substrate, said contact structure comprising a resilient portion, an attachment portion attached to the substrate, and a support portion disposed between the attachment portion and the resilient portion;

an electronic component directly attached and electrically connected to the support portion of the contact structure, wherein the electronic component is suspended from the support portion and spaced apart from the substrate such that the electronic component is not directly attached to the substrate or a terminal on the substrate; and a plurality of contact structures, each contact structure comprising the attachment portion attached to the substrate and the contact portion disposed away from the substrate and configured to contact an electronic device to be tested, wherein the electronic component electrically connects one of the contact structures to an electrically conductive structure to which another of the contact structures is also electrically connected.

16. A probe apparatus comprising:

a substrate;

a contact structure attached to the substrate, said contact structure comprising a resilient portion, an attachment portion attached to the substrate, and a support portion disposed between the attachment portion and the resilient portion;

an electronic component directly attached and electrically connected to the support portion of the contact structure, wherein the electronic component is suspended from the support portion and spaced apart from the substrate such that the electronic component is not directly attached to the substrate or a terminal on the substrate; and a plurality of contact structures, each contact structure comprising the attachment portion attached to the substrate and the contact portion disposed away from the substrate and configured to contact an electronic device to be tested, wherein the electronic component electrically connects at least two of the contact structures, and the contact portions of the at least two of the contact structures are independently moveable with respect to each other, and wherein electrical characteristics of the electronic component do not change while the contact structures move.

17. A probe apparatus comprising:

a substrate;

a contact structure attached to the substrate, said contact structure comprising a resilient portion, an attachment portion attached to the substrate, and a support portion disposed between the attachment portion and the resilient portion;

an electronic component directly attached and electrically connected to the support portion of the contact structure, wherein the electronic component is suspended from the support portion and spaced apart from the substrate such that the electronic component is not directly attached to the substrate or a terminal on the substrate: and a plurality of contact structures, each contact structure comprising the attachment portion attached to the substrate and the contact portion disposed away from the substrate and configured to contact an electronic device to be tested, wherein the electronic component electrically connects at least two of the contact structures, and the contact portions of the at least two of the contact structures are independently moveable with respect to each other, and wherein the electronic component comprises a capacitor, and a distance between physically separated conductors of the capacitor does not change while the contact structures move.

18. A probe apparatus comprising:

a substrate;

a contact structure attached to the substrate, said contact structure comprising a resilient portion, an attachment portion attached to the substrate, and a support portion disposed between the attachment portion and the resilient portion;

an electronic component directly attached and electrically connected to the support portion of the contact structure, wherein the electronic component is suspended from the support portion and spaced apart from the substrate such that the electronic component is not directly attached to the substrate or a terminal on the substrate; and a second contact structure attached to the substrate, the second contact structure comprising a second resilient portion, a second attachment portion attached to the substrate, and a second support portion disposed between the second attachment portion and the second resilient portion, wherein the electrical component is also directly attached to and electrically connected to the second support portion of the second contact structure, wherein the support portion comprises a first platform disposed on the attachment portion, and the resilient portion comprises a first cantilevered beam extending from the first platform;

the second support portion comprises a second platform disposed on the second attachment portion, and the second resilient portion comprises a second cantilevered beam extending from the second platform; and a first terminal of the electronic component is attached to the first platform, and a second terminal of the electronic component is attached to the second platform.

* * * * *